US012750046B2

(12) United States Patent
Yakushiji et al.

(10) Patent No.: US 12,750,046 B2
(45) Date of Patent: Sep. 29, 2026

(54) COMPARATOR, AMPLIFIER, AND SOLID-STATE IMAGING DEVICE

(71) Applicant: Sony Semiconductor Solutions Corporation, Kanagawa (JP)

(72) Inventors: Yuken Yakushiji, Fukuoka (JP); Hideki Tanaka, Fukuoka (JP); Daisuke Miyazaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 222 days.

(21) Appl. No.: 18/837,471

(22) PCT Filed: Feb. 3, 2023

(86) PCT No.: PCT/JP2023/003630
§ 371 (c)(1),
(2) Date: Feb. 27, 2025

(87) PCT Pub. No.: WO2023/181663
PCT Pub. Date: Sep. 28, 2023

(65) Prior Publication Data

US 2025/0192765 A1 Jun. 12, 2025

(30) Foreign Application Priority Data

Mar. 24, 2022 (JP) ................................. 2022-049068

(51) Int. Cl.
*H03K 5/24* (2006.01)
*H03F 3/45* (2006.01)
(Continued)

(52) U.S. Cl.
CPC ....... *H03K 5/2481* (2013.01); *H03F 3/45179* (2013.01); *H04N 25/772* (2023.01); *H04N 25/78* (2023.01)

(58) Field of Classification Search
CPC ............. H03K 5/2481; H03F 3/45179; H04N 25/772; H04N 25/78; H04N 25/67; H04N 25/778
See application file for complete search history.

(56) References Cited

U.S. PATENT DOCUMENTS

2016/0315604 A1* 10/2016 Zhan .................... H03K 5/2481
2021/0250530 A1 8/2021 Paik
(Continued)

FOREIGN PATENT DOCUMENTS

JP 2008182534 A 8/2008
JP 2020102806 A 7/2020
(Continued)

OTHER PUBLICATIONS

International Search Report (PCT/ISA/210), International Application No. PCT/JP2023/003630, dated Apr. 25, 2023.

*Primary Examiner* — Gevell V Selby
(74) *Attorney, Agent, or Firm* — Michael Best & Friedrich LLP

(57) ABSTRACT

Comparators, amplifiers and solid-state imaging devices are disclosed. In one example, a comparator includes transistors, switches, and capacitors. A reference signal is input to a first transistor. A second transistor shares a source with the first transistor. A third transistor shares a source with the first transistor and a drain with the second transistor. A first switch is connected between a gate and the drain of the second transistor. A second switch is connected between a gate and the drain of the third transistor. A first capacitor is connected to the second transistor and an input signal terminal. A second capacitor is connected to the third transistor and the input signal terminal. A fourth transistor shares a drain with the first transistor. A fifth transistor shares a drain with the second transistor and the third transistor, and shares a gate with the fourth transistor.

20 Claims, 22 Drawing Sheets

(51) Int. Cl.
*H04N 25/772* (2023.01)
*H04N 25/78* (2023.01)

(56) References Cited

U.S. PATENT DOCUMENTS

| | | | | |
|---|---|---|---|---|
| 2022/0078362 | A1 | 3/2022 | Jung | |
| 2022/0201231 | A1* | 6/2022 | Ebihara | H03K 5/24 |
| 2024/0396541 | A1* | 11/2024 | Elies | H03K 5/2481 |

FOREIGN PATENT DOCUMENTS

| | | | |
|---|---|---|---|
| JP | 2021153210 | A | 9/2021 |
| WO | 2017119220 | A1 | 7/2017 |

* cited by examiner

COMPARATOR, AMPLIFIER, AND SOLID-STATE IMAGING DEVICE

TECHNICAL FIELD

The present disclosure relates to a comparator, an amplifier, and a solid-state imaging device.

BACKGROUND ART

High dynamic range (HDR) technology is technology for widely expressing a dynamic range in an imaging device. In this HDR technology, it is desirable to suppress artifacts during image processing. In order to reduce the influence of artifacts, there is a single-frame HDR (SFHDR) mode in which image data is synthesized after being read twice at two different gains. In this SFHDR, analog to digital (AD) conversion is executed in the order of reset at low gain, reset at high gain, data input at high gain, and data input at low gain.

In some cases, a two-input comparator includes two systems each including a differential pair, a capacitance to be reset, a switch for selecting input, a switch for selecting output, and the like in order to avoid a decrease in a frame rate, and thus, performs AD conversion at high gain while holding a reset level signal at low gain to realize the AD conversion twice by one circuit. The configuration of this comparator has a problem that a significant increase in circuit area is required as compared with the case of one input. For example, because two systems of the differential amplification pairs are disposed or a reset transistor is required in both differential pairs, the area of the transistor, the switch, and the like becomes very large, and the area condition used as the solid-state imaging element is often not satisfied. Furthermore, because the switch is inserted into an output path of the amplifier, there is a concern of deterioration in characteristics such as generation of vertical stripes due to gain, and there is a problem that the size of the switch itself increases in order to avoid this.

CITATION LIST

Patent Document

Patent Document 1: Japanese Patent Application Laid-Open No. 2020-102806

SUMMARY OF THE INVENTION

Problems to be Solved by the Invention

Therefore, the present disclosure provides a comparator with improved characteristics and a solid-state imaging device using the comparator.

Solutions to Problems

According to an embodiment, a comparator includes a first transistor, a second transistor, a third transistor, a first switch, a second switch, a first capacitor, a second capacitor, a fourth transistor, and a fifth transistor. The first transistor has a gate to which a reference signal is input. The second transistor has a source connected to a source of the first transistor. The third transistor has a source connected to the source of the first transistor and has a drain connected to a drain of the second transistor. The first switch is connected between a gate and the drain of the second transistor. The second switch is connected between a gate and the drain of the third transistor. The first capacitor has a first end connected to the gate of the second transistor and a second end connected to an input signal terminal. The second capacitor has a first end connected to the gate of the third transistor and a second end connected to the input signal terminal. The fourth transistor has a drain connected to a drain of the first transistor and has a gate connected to the drain of the fourth transistor. The fifth transistor has a drain connected to the drain of the second transistor and the drain of the third transistor, and has a gate connected to the gate of the fourth transistor. In the comparator, a potential of the drain of the fourth transistor or a potential of the drain of the fifth transistor is selectively connected to an output terminal.

The comparator may further include a third switch connected between the second end of the first capacitor and a power supply voltage, and a fourth switch connected between the second end of the second capacitor and the power supply voltage.

The comparator may further include a fifth switch connected between a drain of the fifth transistor and the output terminal, and a sixth switch connected between a gate of the fifth transistor and the output terminal, in which the fifth switch and the sixth switch may be exclusively turned on.

The comparator may further include a seventh switch connected between the second end of the first capacitor and the input terminal, and an eighth switch connected between the second end of the second capacitor and the input terminal.

The first transistor, the second transistor, and the third transistor may each be a metal oxide semiconductor field-effect transistor (MOSFET) of a first conductivity type, and the fourth transistor and the fifth transistor may each be a MOSFET of a second conductivity type different from the first conductivity type.

The first conductivity type may be a p-type, and the second conductivity type may be an n-type.

The first transistor, the second transistor, and the third transistor may each have the source connected to a positive-side power supply voltage, and the fourth transistor and the fifth transistor may each have the source connected to a negative-side power supply voltage.

The first conductivity type may be an n-type, and the second conductivity type may be a p-type.

The first transistor, the second transistor, and the third transistor may each have the source connected to a negative-side power supply voltage, and the fourth transistor and the fifth transistor may each have a source connected to a positive-side power supply voltage.

The comparator may further include a ninth switch connected between a drain of the second transistor and a drain of the fifth transistor, and a tenth switch connected between a drain of the third transistor and a drain of the fifth transistor.

The reference signal may be a signal in which a first ramp signal that acquires a pixel value controlled with a first gain and a second ramp signal that acquires a pixel value controlled with a second gain higher than the first gain are switched, the second transistor May form a differential pair with the first transistor and output a current based on the first ramp signal and a voltage applied to the input signal terminal, and the third transistor may form a differential pair with the first transistor and output a current based on the second ramp signal and a voltage applied to the input signal terminal.

According to an embodiment, a comparator includes a first transistor, a second transistor, a first switch, a first capacitor, a second capacitor, a fourth transistor, and a fifth transistor. The first transistor has a gate to which a reference signal is input. The second transistor has a source connected to a source of the first transistor. The first switch is connected between a gate and the drain of the second transistor. The first capacitor has a first end connected to the gate of the second transistor and a second end connected to an input signal terminal. The second capacitor has a first end connected to the gate of the second transistor and a second end connected to the input signal terminal, and is provided in parallel to the first capacitor. The fourth transistor has a drain connected to a drain of the first transistor and has a gate connected to the drain of the fourth transistor. The fifth transistor has a drain connected to the drain of the second transistor and has a gate connected to the gate of the fourth transistor. In the comparator, a potential of the drain of the fourth transistor or a potential of the drain of the fifth transistor is selectively connected to an output terminal.

The comparator may further include a seventh switch connected between the first capacitor and the input signal terminal, and an eighth switch connected between the second capacitor and the input signal terminal.

The comparator may further include an eleventh switch provided between the first capacitor and the gate of the second transistor, and a twelfth switch provided between the second capacitor and the gate of the second transistor.

The reference signal may be a signal in which a first ramp signal that acquires a pixel value controlled with a first gain and a second ramp signal that acquires a pixel value controlled with a second gain higher than the first gain are switched, the second transistor may form a differential pair with the first transistor and selectively output a current based on the first ramp signal and a voltage applied to the input signal terminal, or a current based on the second ramp signal and a voltage applied to the input signal terminal.

According to an embodiment, an amplifier circuit includes: a ramp signal output circuit that generates a reference signal; and, in a first path and a second path that perform processing of two systems, a first amplifier circuit of a first path including the comparator according to any one of the above and connected to the ramp signal output circuit, a first amplifier circuit of a second path including the comparator according any one of the above, connected to the ramp signal output circuit, and is disposed adjacent to the first amplifier circuit of the first path, a second amplifier circuit of a first path connected to the first amplifier circuit of the first path and disposed adjacent to the first amplifier circuit of the second path, a second amplifier circuit of a second path connected to the first amplifier circuit of the second path and disposed adjacent to the second amplifier circuit of the first path, a third amplifier circuit of a first path connected to the second amplifier circuit of the first path and disposed adjacent to the second amplifier circuit of the second path, and a third amplifier circuit of a second path connected to the second amplifier circuit of the second path and disposed adjacent to the third amplifier circuit of the first path.

According to an embodiment, a solid-state imaging device includes a light receiving element, a pixel circuit, a comparator, and a converter. The pixel circuit outputs a signal output from the light receiving element at timing based on a control signal from a control circuit. The comparator is a comparator having an appropriate configuration among configurations described above, in which a signal output from the pixel circuit is input to an input signal terminal. The converter converts an analog signal output from the pixel circuit into a digital signal by using a differential amplification signal based on the first ramp signal and a differential amplification signal based on the second ramp signal output from the comparator.

The solid-state imaging device may further include an image processing circuit that generates a high dynamic range (HDR) image on the basis of a signal output from the converter.

A solid-state imaging device includes a light receiving element, a pixel circuit, a comparator, and a converter. The pixel circuit outputs a signal output from the light receiving element at timing based on a control signal from a control circuit. The comparator is a comparator having an appropriate configuration among configurations described above, in which a signal output from the pixel circuit is input to an input signal terminal. The converter converts an analog signal output from the pixel circuit into a digital signal by using a differential amplification signal based on the first ramp signal and a differential amplification signal based on the second ramp signal output from the comparator.

The solid-state imaging device may further include an image processing circuit that generates a high dynamic range (HDR) image on the basis of a signal output from the converter.

MODE FOR CARRYING OUT THE INVENTION

Figure 1:
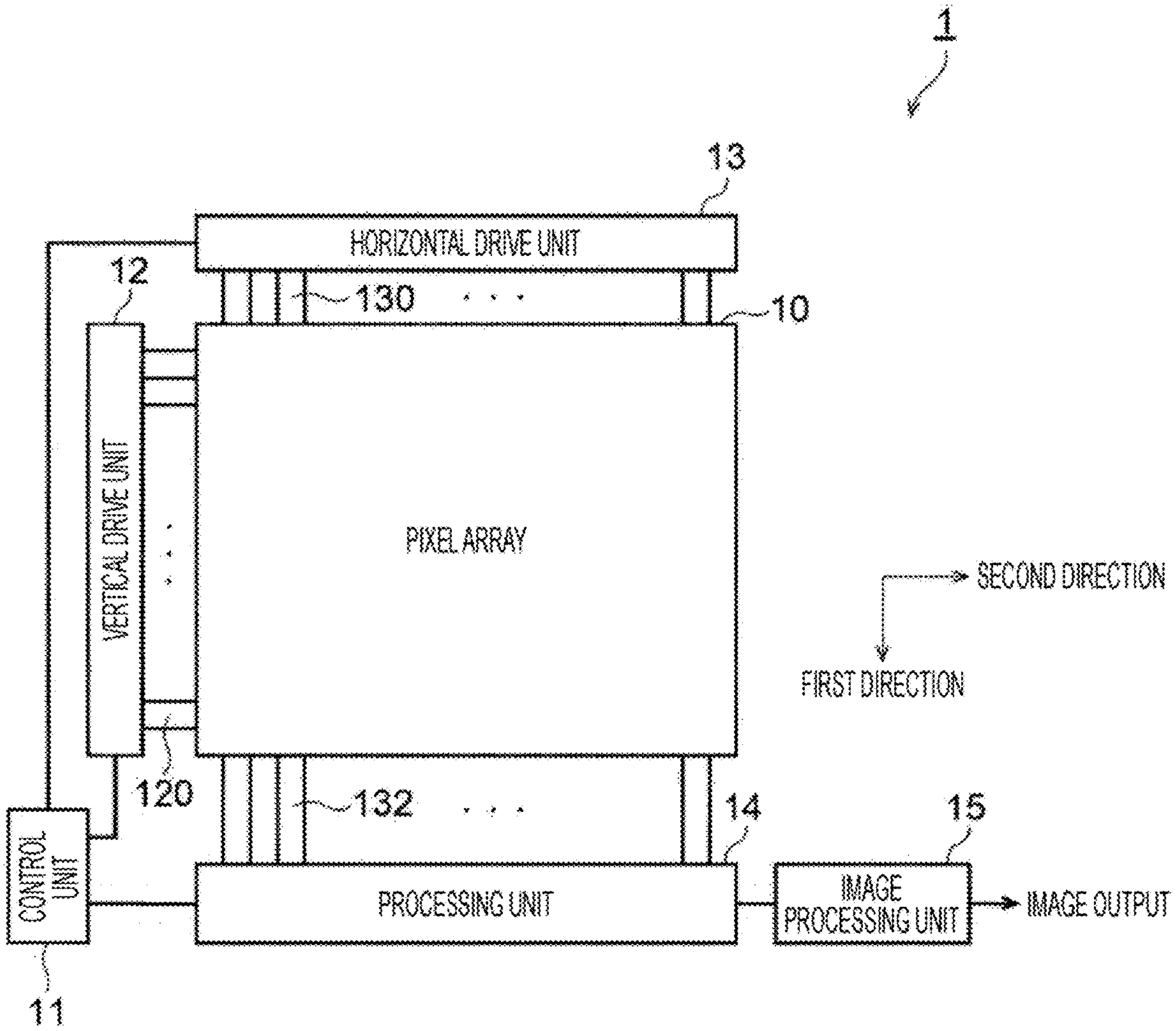
FIG. 1 is a diagram illustrating an example of a solid-state imaging device according to an embodiment.

Hereinafter, embodiments of the present disclosure will be described with reference to the drawings. The drawings are used for explanation, and the shape and size of the configuration of each part in the actual device, the ratio of size to other configurations, and the like are not necessarily as illustrated in the drawings. Furthermore, because the drawings are illustrated in a simplified manner, it should be understood that configurations necessary for implementation other than those illustrated in the drawings are provided as appropriate.

FIG. 1 is a diagram illustrating a non-limiting example of a solid-state imaging device using a comparator according to the present disclosure. The solid-state imaging device 1 includes a pixel array 10, a control unit 11, a vertical drive unit 12, a horizontal drive unit 13, a processing unit 14, and an image processing unit 15. Furthermore, although not illustrated, the solid-state imaging device 1 may include, for example, at least one of a power supply circuit, a storage circuit, other modules required for light reception (and display), an interface related to input and output by the user, or the like.

The pixel array 10 is a region in which light receiving pixels are arranged in a two-dimensional array in a first direction and a second direction intersecting the first direction. A light receiving pixel (hereinafter, also simply referred to as a pixel) includes a light receiving element and a pixel circuit. The light receiving element receives light and acquires an analog signal corresponding to the intensity of the received light. The pixel circuit outputs a signal output from the light receiving element at appropriate timing.

The control unit 11 executes control of processing in a light receiving part of the solid-state imaging device 1. The control unit 11 controls, for example, the vertical drive unit 12, the horizontal drive unit 13, and the processing unit 14 at appropriate timing to control acquisition of information regarding an image.

The vertical drive unit 12 selects and drives a line in the pixel array 10. The line is a set of pixels along the second direction. The vertical drive unit 12 selects one or a plurality of lines in the first direction, and drives the pixels belonging to the line to control the pixels to be in a state in which output can be performed from the pixels.

The vertical drive unit 12 applies an appropriate voltage to a horizontal signal line 120 provided for every line for the pixels belonging to the pixel array 10 to drive the pixels belonging to the line into a state in which output can be performed from the pixels.

The horizontal drive unit 13 selects a column in the pixel array 10 and selects and drives a pixel to be output from among pixels belonging to the column.

The vertical drive unit 12 applies an appropriate voltage to a vertical signal line 130 provided for every column for the pixels belonging to the pixel array 10 to drive the pixel belonging to the column so that a signal can be output from the pixel. That is, the pixel that has received the drive signal from the horizontal drive unit 13 in the line selected by the vertical drive unit 12 outputs a signal based on the received intensity.

The processing unit 14 outputs the signal from the pixel acquired via a vertical signal line 132 by performing appropriate processing.

The image processing unit 15 constitutes an image by appropriately processing a digital signal output from the processing unit 14, or performs image processing and outputs the processed signal as an image signal.

As a non-limiting example, the comparator described in the present disclosure may be provided for every column in the processing unit 14. For example, the processing unit 14 counts the output from the comparator by using a clock signal to convert the analog signal output from the pixel circuit into a digital signal and output the digital signal to the image processing unit 15.

As another non-limiting example, the comparator may be provided for every pixel, and in this case, the analog signal may be converted into the digital signal for every pixel, or the processing unit 14 may convert the analog signal into the digital signal on the basis of a comparison result output from the pixel.

In the above description, each component may be formed by an appropriate dedicated circuit or a general-purpose circuit. At least some of the circuits may be formed by using a general-purpose processor. For example, the image processing unit 15 may include a processor, and the processing in the image processing unit 15 may be in a form in which information processing by software is specifically realized by using the processor. In this case, a program for executing information processing related to the image processing and one that is equivalent to the program may be stored in a storage circuit provided inside or outside the solid-state imaging device 1.

Figure 2:
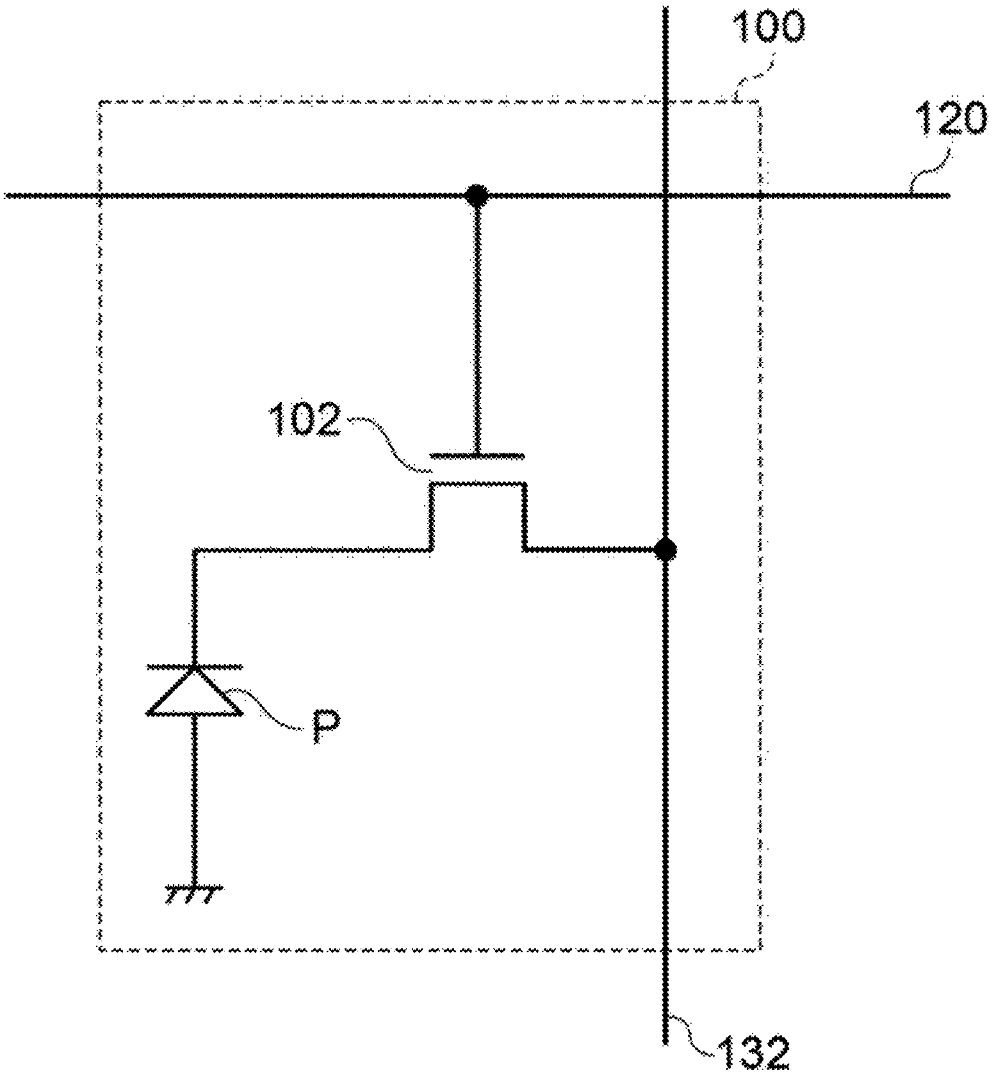
FIG. 2 is a diagram illustrating an example of a pixel circuit according to the embodiment.

FIG. 2 is a diagram illustrating a non-limiting example of the pixel circuit according to the embodiment. As a simple example, a pixel circuit 100 may include a light receiving element P and a transfer transistor 102.

The pixel circuit 100 outputs an analog signal corresponding to the intensity of light received by the light receiving element P by driving the transfer transistor 102. The transfer transistor 102 is driven by a voltage applied to the gate, and outputs an analog signal corresponding to the intensity of light received by the light receiving element P via the vertical signal line 132 whose output is selected by the horizontal drive unit 13.

Figure 3:
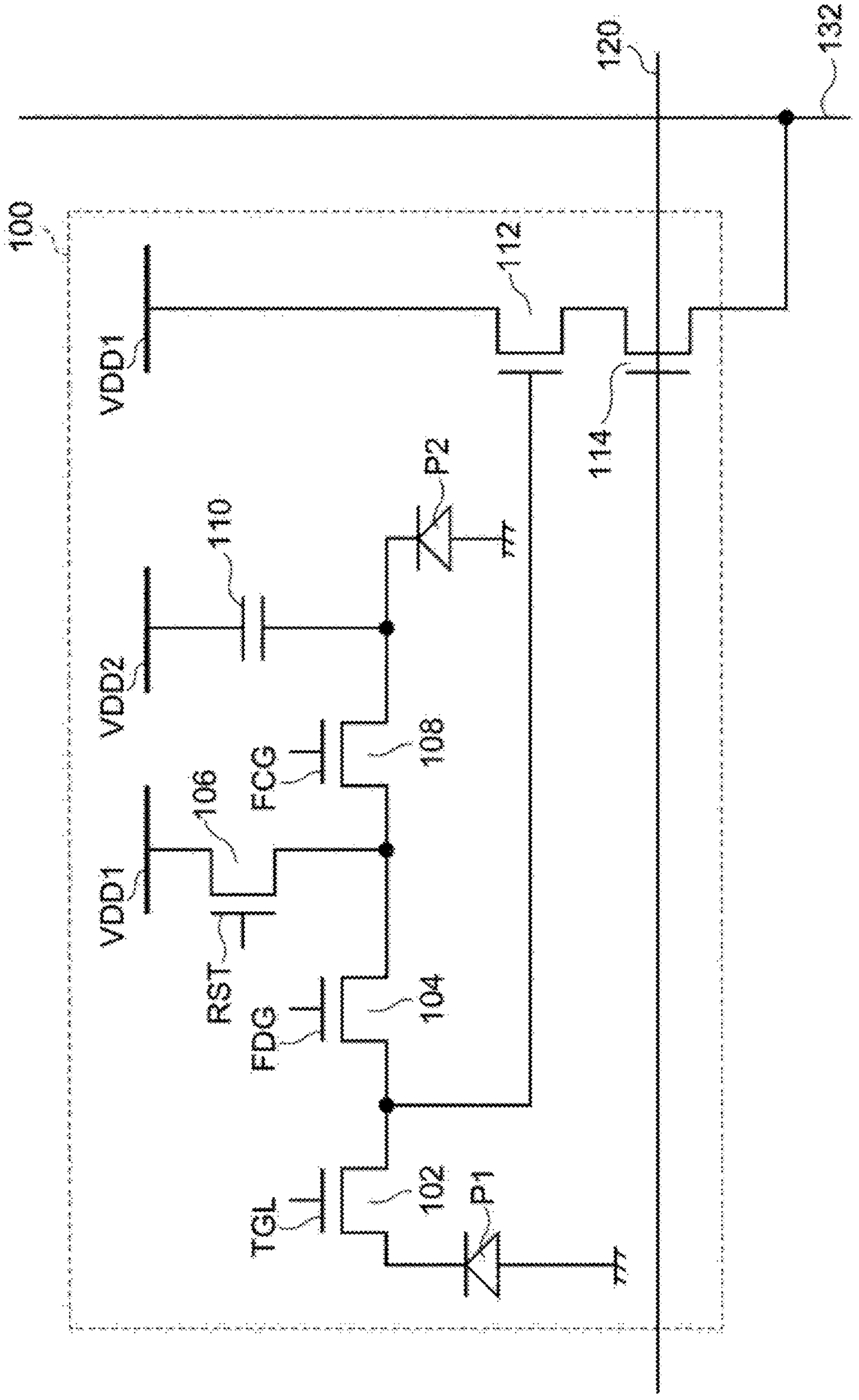
FIG. 3 is a diagram illustrating an example of the pixel circuit according to the embodiment.

FIG. 3 is a diagram illustrating a non-limiting example of the pixel circuit according to the embodiment. As compared with FIG. 2, two light receiving elements P1 and P2 having different sensitivities are provided, and outputs from these light receiving elements are selectively output. For example, the light receiving element P1 is a pixel having a sensitivity different from that of the light receiving element P2, and can receive light having the intensity in a different range. The light receiving element P1 and the light receiving element P2 are, for example, a combination of light receiving elements in which one thereof receives light in a range of normal intensity, and the other thereof can acquire intensity information with higher accuracy (resolution) in a range of low-sensitivity intensity in which human eyes can easily sense a sensitivity change.

The transfer transistor 102 transfers a signal received by the light receiving element P1 to a floating diffusion on the basis of a voltage TGL applied to the gate at appropriate timing. This transferred signal is amplified by an amplifier transistor 112 and output via the vertical signal line 132 via a select transistor 114 at the timing when the line is selected.

Meanwhile, a signal based on the intensity of the light received by the light receiving element P2 is transferred to the floating diffusion at appropriate timing on the basis of voltages FDG and FCG respectively applied to the gates of the transfer transistors 104 and 108. This transferred signal is amplified by an amplifier transistor 112 and output via the vertical signal line 132 via a select transistor 114 at the timing when the line is selected.

By outputting the signals from the light receiving elements P1 and P2 at appropriate timing, signals from pixels having different sensitivities can be obtained. These signals can be used as, for example, signals for forming an HDR image. At appropriate timing, the floating diffusion is reset to a reference voltage via a reset transistor 106.

Figure 4:
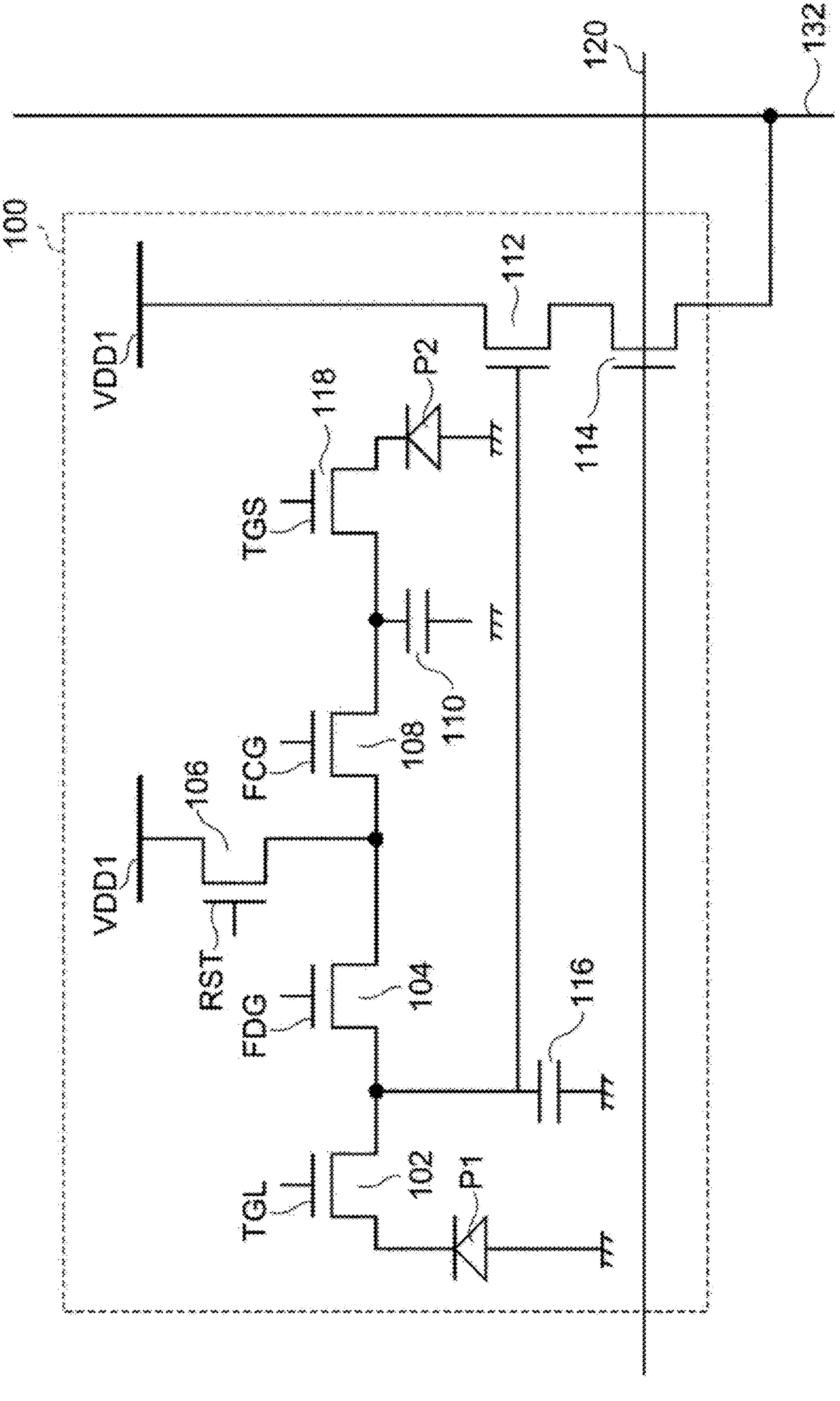
FIG. 4 is a diagram illustrating an example of the pixel circuit according to the embodiment.

FIG. 4 is a diagram illustrating a non-limiting example of the pixel circuit according to the embodiment. Similarly to FIG. 3, the light receiving elements P1, P2 having different sensitivities are provided.

The pixel circuit 100 includes the light receiving elements P1 and P2, transfer transistors 102, 104, 108, and 118, the reset transistor 106, the amplifier transistor 112, the select transistor 114, and a capacitor 110. The capacitor 110 may be, for example, a metal oxide semiconductor (MOS) capacitor or a metal insulator semiconductor (MIS) capacitor.

The transfer transistors 102, 104, 108, and 118 are connected in series between the light receiving element P1 and the light receiving element P2. The charge output from the light receiving element is temporarily held in the floating diffusion connected between the transfer transistor 102 and the transfer transistor 104. A parasitic capacitance may be present in the floating diffusion.

The horizontal signal line 120 in FIG. 1 is wired to the pixel circuit 100 for every pixel line. Various drive signals TGL, FDG, FCG, TGS, RST, and the like are supplied from the vertical drive unit 12 in FIG. 1 via a plurality of drive lines (horizontal signal lines 120). These drive signals are switched between an on state and an off state according to the conductivity type of each transistor of the pixel circuit 100.

The drive signal TGL is applied to a gate electrode of the transfer transistor 102. When the transfer transistor 102 is turned on by the drive signal TGL, the charge accumulated in the light receiving element P1 is transferred to the floating diffusion via the transfer transistor 102.

The drive signal FDG is applied to the gate electrode of the transfer transistor 104. When the transfer transistor 104 is turned on by the drive signal FDG, the potentials of regions through the floating diffusion are combined to form one floating diffusion.

The drive signal FCG is applied to the gate electrode of the transfer transistor 108. When the transfer transistors 104 and 108 are turned on by the drive signals FCG and FDG, the regions where the floating diffusion is formed becomes larger.

The drive signal TGS is applied to the gate electrode of the transfer transistor 118. When the transfer transistor 118 is turned on by the drive signal TGS, the charge accumulated in the light receiving element P2 is transferred to the capacitor 110 via the transfer transistor 118. In a case where the transfer transistor 118, the transfer transistor 108, and the transfer transistor 104 are turned on, the potentials from the capacitor 110 to the floating diffusion are combined, and the charge accumulated in the light receiving element P2 is transferred to this combined charge accumulation region.

The channel region under the gate electrode of the transfer transistor 118 may be formed such that the potential is in a positive direction (in other words, the potential is deep) with respect to the channel region under the gate electrode of at least one of the transfer transistors 102, 104, and 108. By forming the circuit in this manner, an overflow path of the charge may be formed.

In a case where the charge exceeding an amount of saturation charge of the light receiving element P2 is generated as a result of photoelectric conversion in the light receiving element P2, the charge exceeding the amount of saturation charge can overflow from the light receiving element P2 to the capacitor 110 via the overflow path described above. The overflowed charge may be accumulated in the capacitor 110.

In FIG. 4, among the two electrodes included in the capacitor 110, a first electrode is a node electrode connected to a node between the transfer transistor 108 and the transfer transistor 118. Among the two electrodes included in the capacitor 110, a second electrode is a grounded electrode.

Note that, as a modification, the second electrode may be connected to a specific potential other than the ground potential, for example, a power supply potential.

In a case where the capacitor 110 is the MOS capacitor or the MIS capacitor, as an example, the second electrode is an impurity region formed on a silicon substrate, and a dielectric film that forms the capacitor is an oxide film or a nitride film formed on the silicon substrate. The first electrode is an electrode formed of a material having conductivity in information of the second electrode and the dielectric film, for example, polysilicon or metal.

In a case where the second electrode is set to the ground potential, the second electrode may be a p-type impurity region electrically connected to the p-type impurity region provided in the light receiving element P1 or the light receiving element P2. In a case where the second electrode is set to a specific potential other than the ground potential, the second electrode may be an n-type impurity region formed in the p-type impurity region.

In addition to the transfer transistor 104, the reset transistor 106 is also connected to a node between the transfer transistors 102 and 104. A specific potential, for example, a power supply VDD is connected to a source of the reset transistor 106. The drive signal RST is applied to the gate electrode of the reset transistor 106. When the reset transistor 106 is turned on by the drive signal RST, the potential of the node between the transfer transistors 102 and 104 is reset to the level of the voltage VDD.

When the reset transistor 106 is turned on by the drive signal RST, by activating the drive signal FDG of the transfer transistor 104 and the drive signal FCG of the transfer transistor 108, the potentials of the floating diffusion and the capacitor 110 are reset to the voltage VDD at the node where the potential is combined.

Note that by individually controlling the drive signal FDG and the drive signal FCG, the potentials of the floating diffusion and the capacitor 110 can be individually (independently) reset to the level of the voltage VDD.

The floating diffusion is charge-voltage conversion means. That is, when the charge is transferred to the floating diffusion, the potential of the floating diffusion changes according to the amount of the transferred charge.

In a case where the amplifier transistor 112 is constituted of the n-type MOSFET, the amplifier transistor 112 has a source side connected with a current source connected to one end of the vertical signal line 130 and has a drain side connected with the power supply VDD to form a source follower circuit altogether. The amplifier transistor 112 has the gate electrode connected with the floating diffusion, and this serves as an input of a source follower circuit.

The select transistor 114 is connected between the source of the amplifier transistor 112 and the vertical signal line 132. A drive signal SEL is applied to the gate electrode of the select transistor 114. When the select transistor 114 is turned on by the drive signal SEL, the pixel including the pixel circuit 100 is set to a selected state.

When the charge is transferred to the floating diffusion, the potential of the floating diffusion becomes a potential corresponding to an amount of transferred charge, and the potential is input to the source follower circuit described above. When the drive signal SEL becomes an active state, the potential of the floating diffusion corresponding to the amount of charge is output to the vertical signal line 132 via the select transistor 114 as an output of the source follower circuit.

The light receiving element P1 may have a larger light receiving area of the photodiode than the light receiving element P2. Therefore, in a case where a subject with a certain illuminance is imaged with a certain exposure time, the charge generated in the light receiving element P1 is larger than the charge generated in the light receiving element P2.

Therefore, when the charge generated in the light receiving element P1 and the charge generated in the light receiving element P2 are transferred to the floating diffusion and subjected to charge-voltage conversion, a voltage change before and after the charge generated in the light receiving element P1 is transferred to the floating diffusion is larger than a voltage change before and after the charge generated in the light receiving element P2 is transferred to the floating diffusion. Therefore, comparing the light receiving element P1 and the light receiving element P2, the light receiving element P1 has higher sensitivity than the light receiving element P2.

On the other hand, in the light receiving element P2, even in a case where light with high illuminance is incident and the charge exceeding the amount of saturation charge of the light receiving element P2 is generated, the charge generated by an amount exceeding the amount of saturation charge can be accumulated in the capacitor 110. Therefore, when the charge-voltage conversion is performed on the charge generated in the light receiving element P2, the charge-voltage conversion can be performed after both the charge accumulated in the light receiving element P2 and the charge accumulated in the capacitor 110 are added.

Therefore, the light receiving element P2 can image the pixel having gradation over a wider illuminance range than the light receiving element P1. In other words, an image with a wide dynamic range can be captured.

Two images including a pixel with high sensitivity captured with the light receiving element P1 and an image with a pixel with a wide dynamic range captured with the light receiving element P2 are synthesized into one image through wide dynamic range image synthesis processing of synthesizing one image from the two images in, for example, an image signal processing device provided inside a complementary metal oxide semiconductor (CMOS) image sensor.

Amplifiers that amplify the output from the pixel circuits described above as some non-limiting examples are described below as some non-limiting embodiments of the present disclosure.

First Embodiment

Figure 5:
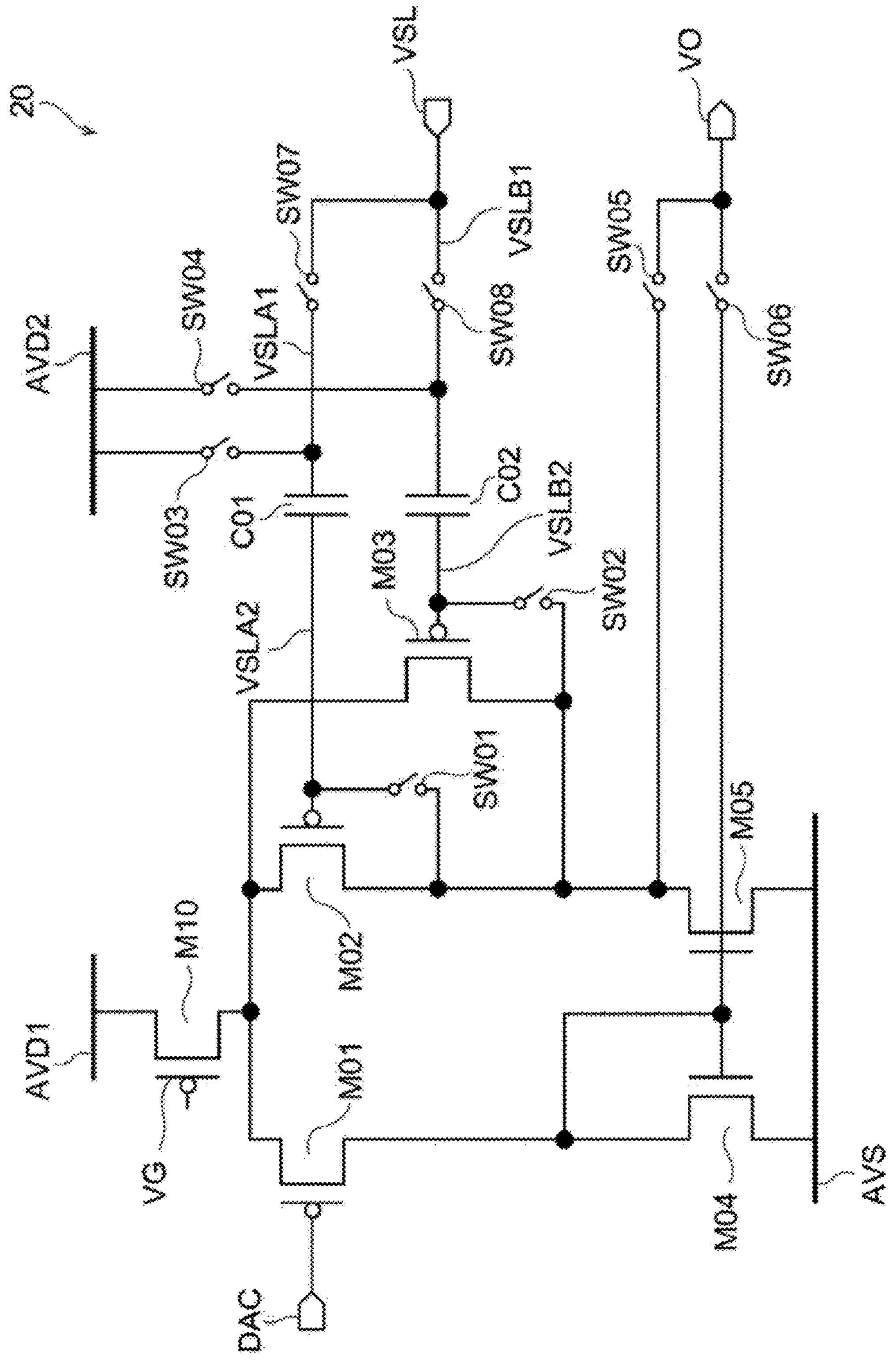
FIG. 5 is a diagram illustrating an example of a comparator according to the embodiment.

FIG. 5 is a circuit diagram illustrating an example of a comparator constituting a part of an amplifier circuit according to an embodiment. A comparator 20 includes at least a first transistor M01, a second transistor M02, a third transistor M03, a fourth transistor M04, a fifth transistor M05, a first switch SW01, a second switch SW02, a third switch SW03, a fourth switch SW04, a fifth switch SW05, a sixth switch SW06, a seventh switch SW07, an eighth switch SW08, a first capacitor C01, and a second capacitor C02. Furthermore, the comparator 20 may include a tenth transistor M10.

The comparator 20 receives a ramp signal from a digital to analog converter (DAC) terminal and an output signal of a pixel circuit from a VSL terminal. The comparator 20 compares the ramp signal with the output signal of the pixel circuit, and outputs a comparison result from a VO terminal. The output of the VO terminal is connected to an amplifier or a timing control circuit, and the analog signal output from the pixel circuit can be converted into a digital signal on the basis of the output, for example, the timing at which the comparison result is switched.

The first transistor M01 is, for example, a p-type MOSFET, and the above-described ramp signal is applied to the gate. The ramp signal is controlled as a reference signal for a signal output from the pixel circuit. The ramp signal may be a signal whose signal value is gradually amplified or a signal whose signal value is gradually attenuated.

A positive-side power supply voltage ADV1 is applied to the source of the first transistor M01. The tenth transistor M10 that switches connection with the power supply may be provided between the power supply voltage ADV1 and the first transistor M01, but the tenth transistor M10 may not be provided.

The second transistor M02 is, for example, a p-type MOSFET, and an output signal from the pixel circuit is input to the gate of the second transistor M02 via a switch, a capacitor that stores the charge based on a signal value, and the like. The second transistor M02 has the source connected to the source of the first transistor M01. The second transistor M02 and the first transistor M01 form a differential input circuit that receives an input of an input signal and a reference signal.

The third transistor M03 is, for example, a p-type MOSFET, and an output signal from the pixel circuit is input to the gate of the third transistor M03 via a switch, a capacitor that stores the charge based on a signal value, and the like. The third transistor M03 has the source connected to the sources of the first transistor M01 and the second transistor M02, and has the drain connected to the drain of the second transistor M02.

The fourth transistor M04 is, for example, an n-type MOSFET, and has the drain connected to the drain of the first transistor M01 and has the source connected to a negative-side power supply voltage AVS. Furthermore, the fourth transistor M04 has the gate connected to the drain. As a non-limiting example, the power supply voltage AVS may be a ground voltage or a voltage obtained by inverting the sign of the positive-side power supply voltage AVD1.

The fifth transistor M05 is, for example, an n-type MOSFET, and has the drain connected to the drain of the second transistor M02 and the drain of the third transistor M03, and has the source connected to the negative-side power supply voltage AVS. Furthermore, the gate of the fifth transistor is connected to the gate of the fourth transistor M04.

The fourth transistor M04 and the fifth transistor M05 constitute a current mirror. The drain of the fourth transistor M04 or the drain of the fifth transistor M05 is selectively connected to the output terminal of the comparator 20.

By having this current mirror connected to a differential input constituted of the first transistor M01, and the second transistor M02 or the third transistor M03, the comparator 20 outputs a comparison result between the reference signal and the input signal (signal output from the pixel circuit).

The first switch SW01 is connected between the gate and the drain of the second transistor M02. This first switch SW01 is turned on to short-circuit the gate and the drain of the second transistor M02.

The second switch SW02 is connected between the gate and the drain of the third transistor M03. This second switch SW02 is turned on to short-circuit the gate and the drain of the third transistor M03.

The first capacitor C01 has one end connected to the gate of the second transistor M02 and has the other end connected to the VSL terminal to which the pixel signal is input. A switch may be provided between the first capacitor C01 and the VSL terminal.

The second capacitor C02 has one end connected to the gate of the third transistor M03 and has the other end connected to the VSL terminal to which the pixel signal is input. A switch may be provided between the first capacitor C01 and the VSL terminal.

The third switch SW03 is connected between the other end of the first capacitor C01 and a positive-side power supply voltage ADV2. The power supply voltage ADV2 may be the same voltage as the power supply voltage ADV1 or may be a different voltage. When the third switch SW03 is turned on, the other end of the first capacitor C01 can be pulled up to the level of the power supply voltage ADV2 and initialized.

The fourth switch SW04 is connected between the other end of the second capacitor C02 and the power supply voltage ADV2. When the fourth switch SW04 is turned on, the other end of the second capacitor C02 can be pulled up to the level of the power supply voltage ADV2 and initialized.

The fifth switch SW05 is connected between the drain of the fifth transistor M05 and the output terminal.

The sixth switch SW06 is connected between the gate of the fifth transistor M05 (the drain of the fourth transistor M04) and the output terminal.

When the fifth switch SW05 and the sixth switch SW06 are exclusively turned on, the output terminal is selectively connected to the drain of the fifth transistor M05 or the drain of the fourth transistor M04.

The seventh switch SW07 is connected between the other end of the first capacitor C01 and the input terminal. By the seventh switch SW07 being turned on, the output from the pixel circuit is applied to the gate of the second transistor M02 via the first capacitor C01.

The eighth switch SW08 is connected between the other end of the second capacitor C02 and the input terminal. By the eighth switch SW08 being turned on, the output from the pixel circuit is applied to the gate of the third transistor M03 via the second capacitor C02.

How the circuit in FIG. 5 operates will be described. For convenience of description, the voltage at the other end of the first capacitor C01 is referred to as VSLA1, and the voltage at one end (the gate of the second transistor M02) of the first capacitor C01 is referred to as VSLA2. Similarly, the voltage at the other end of the second capacitor C02 is referred to as VSLB1, and the voltage at one end of the second capacitor C02 (the gate of the third transistor M03) is referred to as VSLB2.

In this one circuit, the comparator 20 sequentially and selectively outputs a comparison result at high gain and a comparison result at low gain. The order of comparison may be reset at low gain, reset at high gain, comparison (reading) at high gain, and comparison (reading) at low gain. The comparison at high gain and the comparison at low gain are represented by, for example, a gain (signal attenuation or amplification gradient) in a ramp signal that is a reference signal.

In the comparison at high gain and the comparison at low gain, for example, in a case where two types of light receiving elements as illustrated in FIG. 4 and the like are used, the switch may be appropriately switched before input. As another example, in the case of the pixel circuit as illustrated in FIG. 2, it is also possible to realize input of a pixel value for high gain and input of a pixel value for low gain by the capacitance ratio of the first capacitor C01 and the second capacitor C02 serving as differential inputs.

Figure 6:
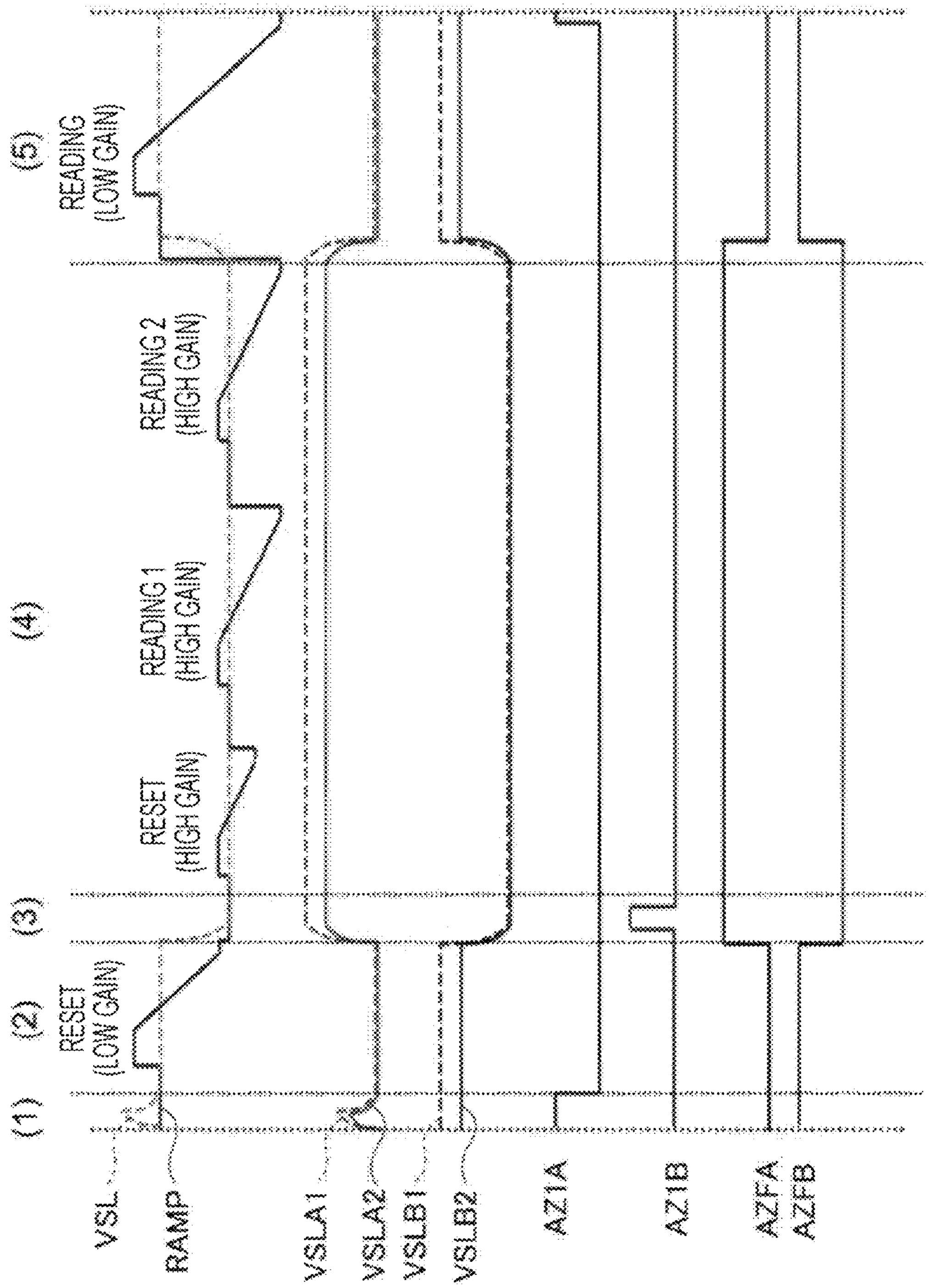
FIG. 6 is a diagram illustrating an example of a timing chart of the comparator according to the embodiment.

FIG. 6 is a timing chart illustrating an example of control in the circuit in FIG. 5. How the comparator 20 operates will be described by using the state of each switch at numerical stages shown at the top of the timing chart.

In the timing chart, RAMP represents a value of a ramp signal input as a reference signal, and VSL represents a value of an input signal input from the pixel circuit to be compared with the ramp signal. VSLA1, VSLA2, VSLB1, and VSLB2 are set as described above. AZ1A and AZ1B indicate signals for control to initialize the second transistor M02 and the third transistor M03, respectively. AZFA and AZFB indicate signals for control of initializing the first capacitor C01 and the second capacitor C02, respectively.

(1) Initialization Period of Second Transistor M02

Figure 7:
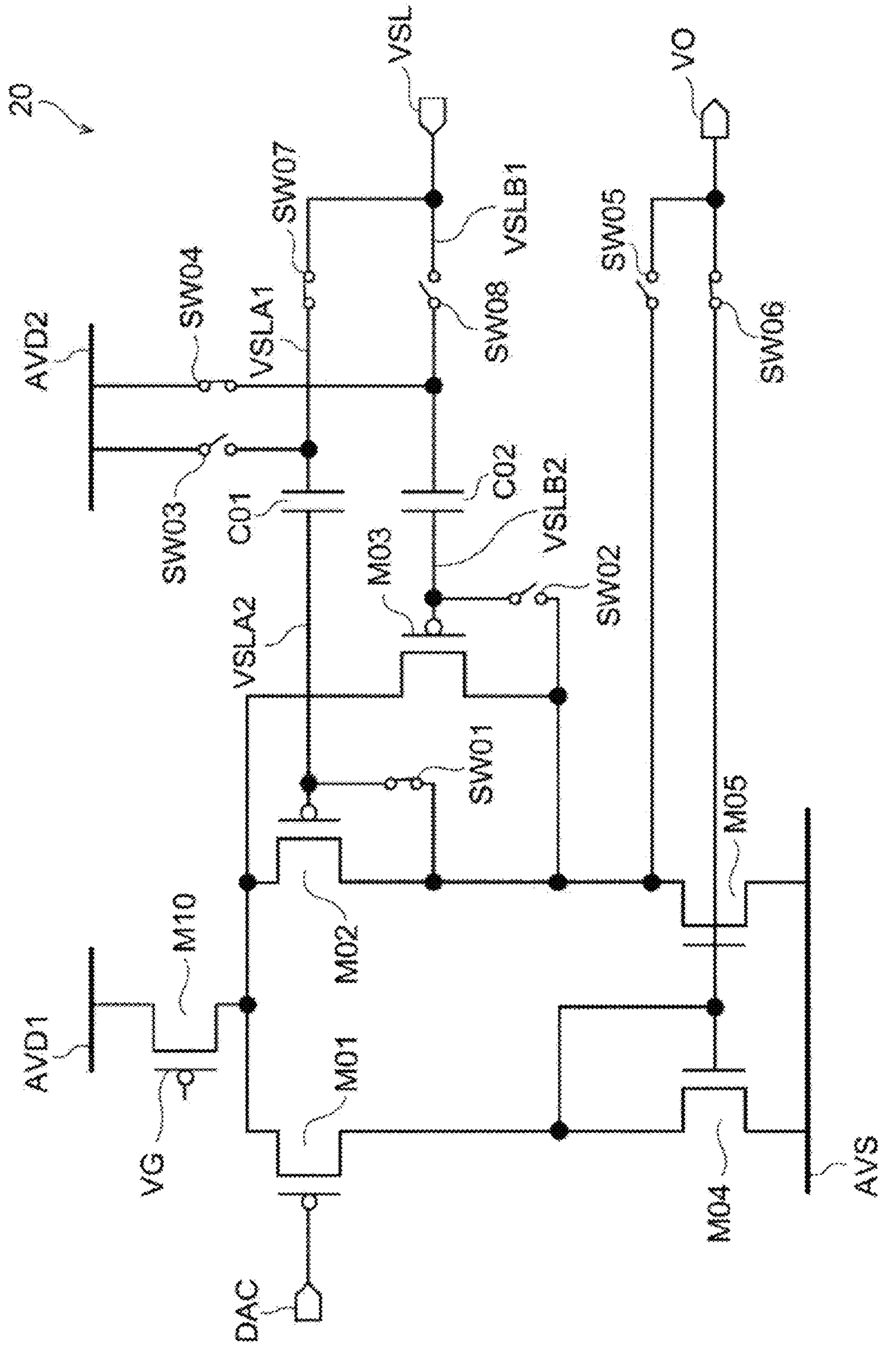
FIG. 7 is a diagram illustrating an example of the comparator according to the embodiment.

FIG. 7 is a circuit diagram corresponding to a period (1) in the timing chart. At this timing, the first switch SW01 is turned on by AZ1A, the second switch SW02 is turned off by AZ1B, the fourth switch SW04 is turned on and the seventh switch SW07 is turned on by AZFA, and the third switch SW03 is turned off and the eighth switch SW08 is turned off by AZFB.

When the first switch SW01 is turned on, the gate and the drain of the second transistor M02 are short-circuited. With this path, the charge of the first capacitor C01 is appropriately accumulated corresponding to the input signal by the current through the fifth transistor M05. As a result, VSLA1 and VSLA2 transition as illustrated in the drawing according to the transition of the input signal VSL.

On the other hand, because the second switch SW02 and the eighth switch SW08 are turned off, the VSLB1 and the VSLB2 do not change.

(2) Reset Period Corresponding to Low Gain

Figure 8:
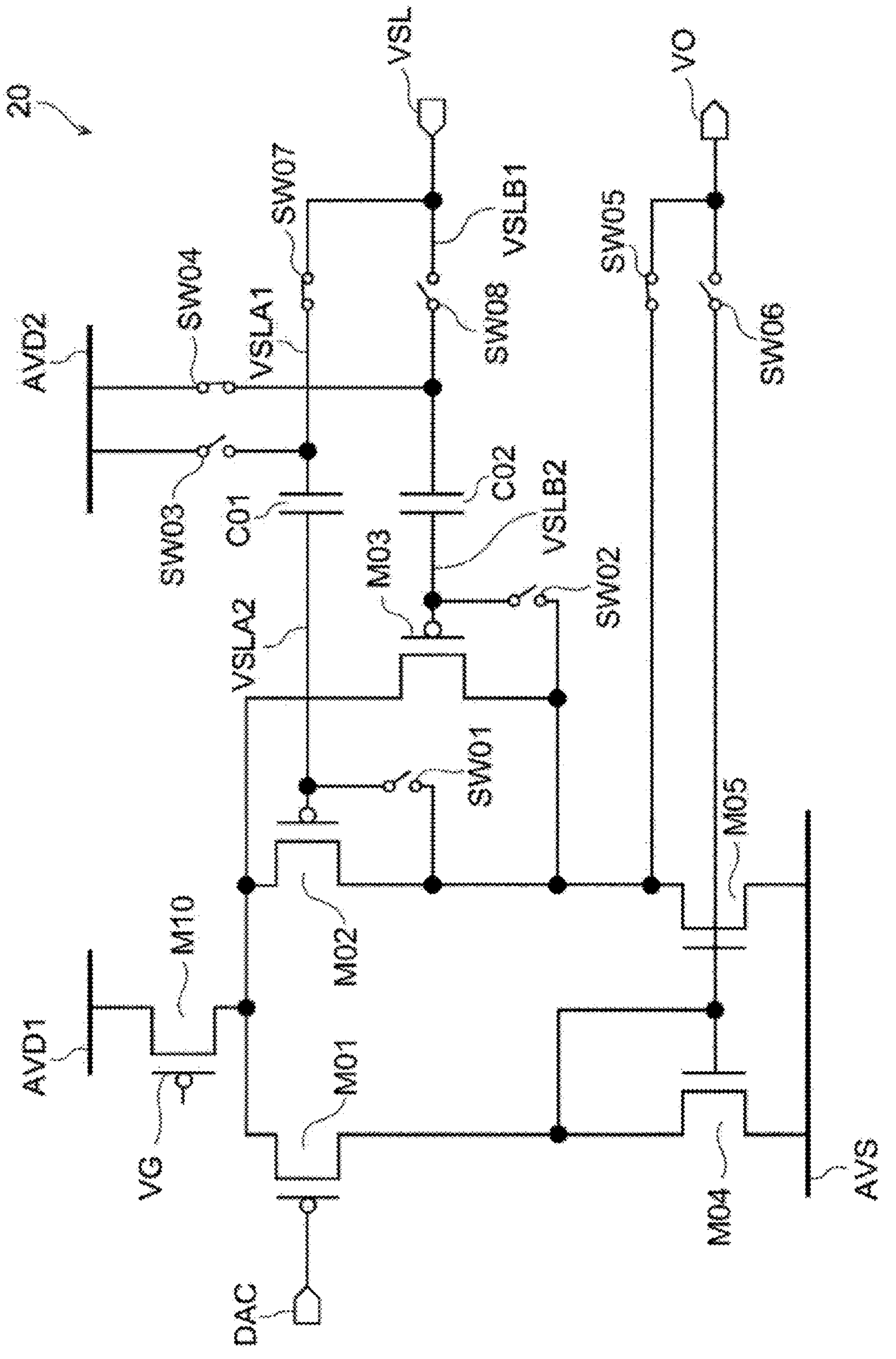
FIG. 8 is a diagram illustrating an example of the comparator according to the embodiment.

FIG. 8 is a circuit diagram corresponding to a period (2) in the timing chart. In this state, the first switch SW01 is turned off, and the gate and the drain of the second transistor M02 are disconnected. At this timing, the comparator 20 has the ramp signal at low gain input thereto and executes reset for reading a signal corresponding to the low gain.

Although not illustrated in the timing chart, the fifth switch SW05 is turned on and the sixth switch SW06 is turned off at this timing, so that the output from the comparator 20 in the reset period is controlled.

(3) Initialization Period of Third Transistor M03

Figure 9:
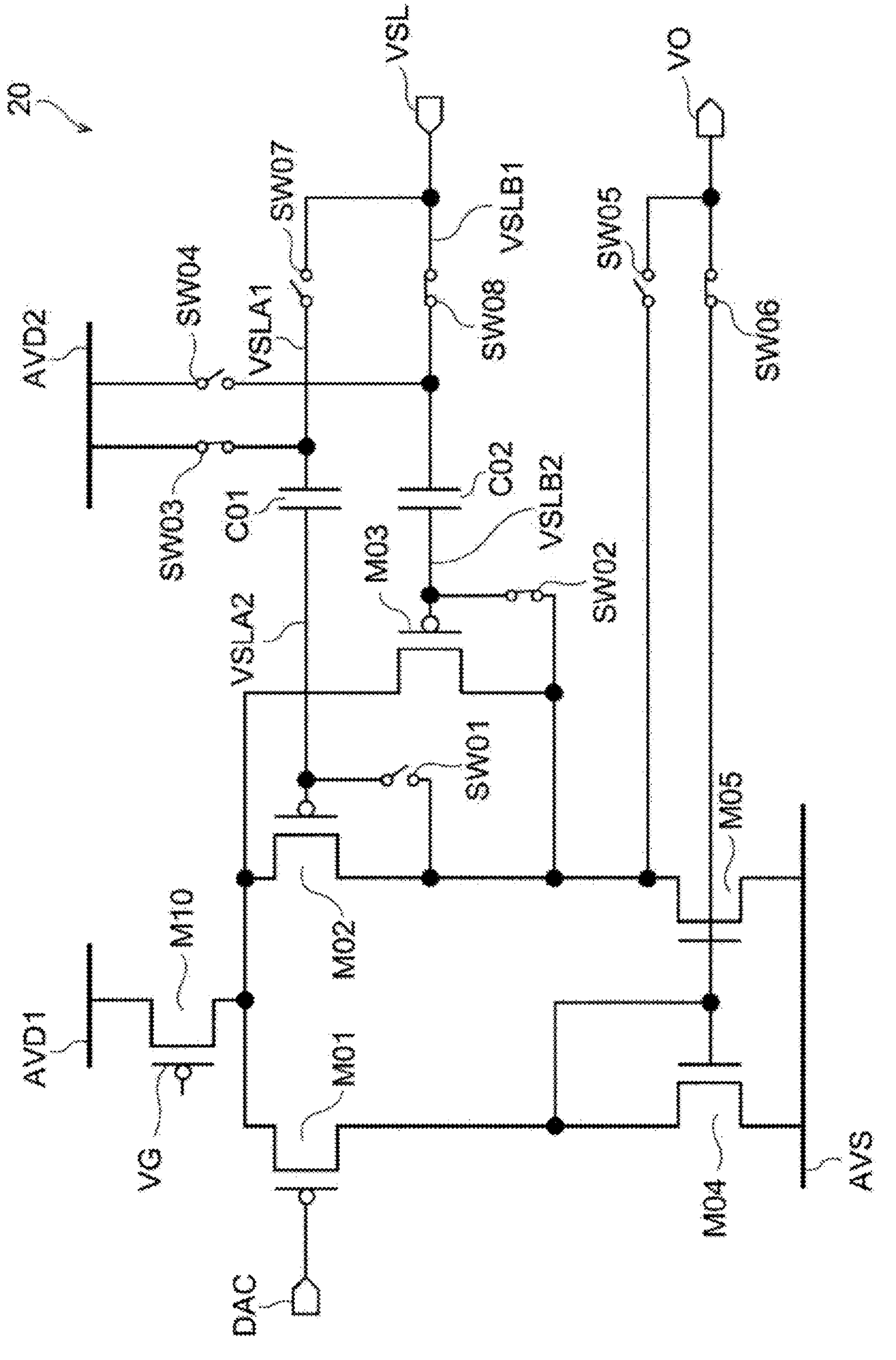
FIG. 9 is a diagram illustrating an example of the comparator according to the embodiment.

FIG. 9 is a circuit diagram corresponding to a period (3) in the timing chart. At this timing, the first switch SW01 is turned off by AZ1A, the second switch SW02 is turned on by AZ1B, the fourth switch SW04 is turned off and the seventh switch SW07 is turned off by AZFA, and the third switch SW03 is turned on and the eighth switch SW08 is turned on by AZFB.

When the second switch SW02 is turned on, the gate and the drain of the third transistor M03 are short-circuited. With this path, the charge of the second capacitor C02 is appropriately accumulated corresponding to the input signal by the current through the fifth transistor M05. As a result, the VSLB1 and the VSLB2 transition as illustrated in the drawing according to the transition of the input signal VSL.

On the other hand, because the first switch SW01 and the seventh switch SW07 transition from on to off and the third switch SW03 transitions from off to on, the potentials of VSLA1 and VSLA2 transition as illustrated in the timing chart.

(4) Reset and Reading Period at High Gain

Figure 10:
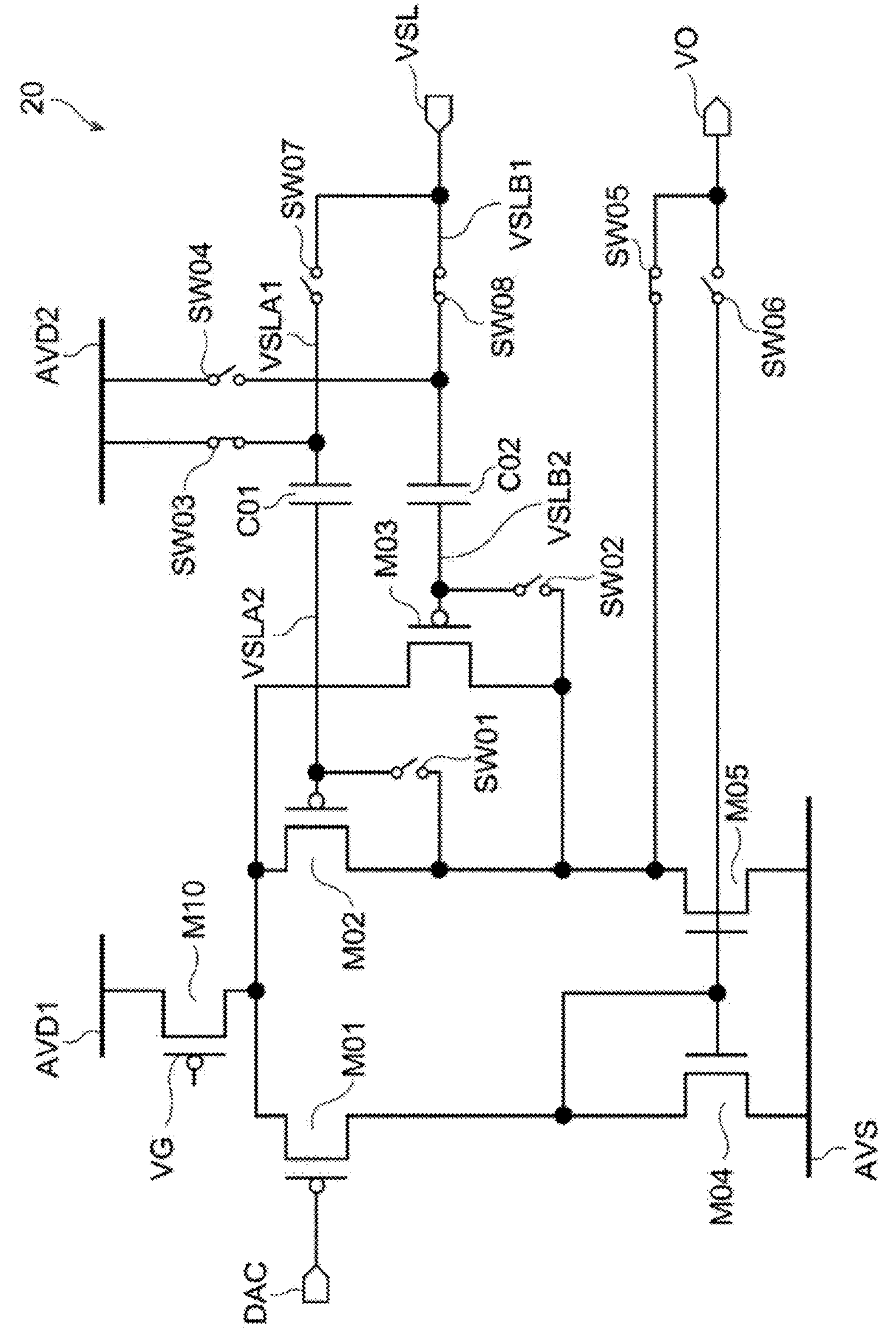
FIG. 10 is a diagram illustrating an example of the comparator according to the embodiment.

FIG. 10 is a circuit diagram corresponding to a period (4) in the timing chart. At this timing, the first switch SW01 is turned off by AZ1A, the second switch SW02 is turned off by AZ1B, the fourth switch SW04 is turned off and the seventh switch SW07 is turned off by AZFA, and the third switch SW03 is turned on and the eighth switch SW08 is turned on by AZFB.

In this period, first, the reference signal corresponding to the high gain is input in a state where the input signal is not input, so that the reset corresponding to the high gain is executed.

Subsequently, by inputting the reference signal and the input signal, reading of the pixel value corresponding to the high gain is executed through the third transistor M03. The read signal value is output via the fifth switch SW05 that is turned on. Furthermore, the reading of the pixel value corresponding to the high gain may be executed twice as shown in the timing chart in order to more accurately execute the reading of the luminance value.

(5) Reading Period at Low Gain

Figure 11:
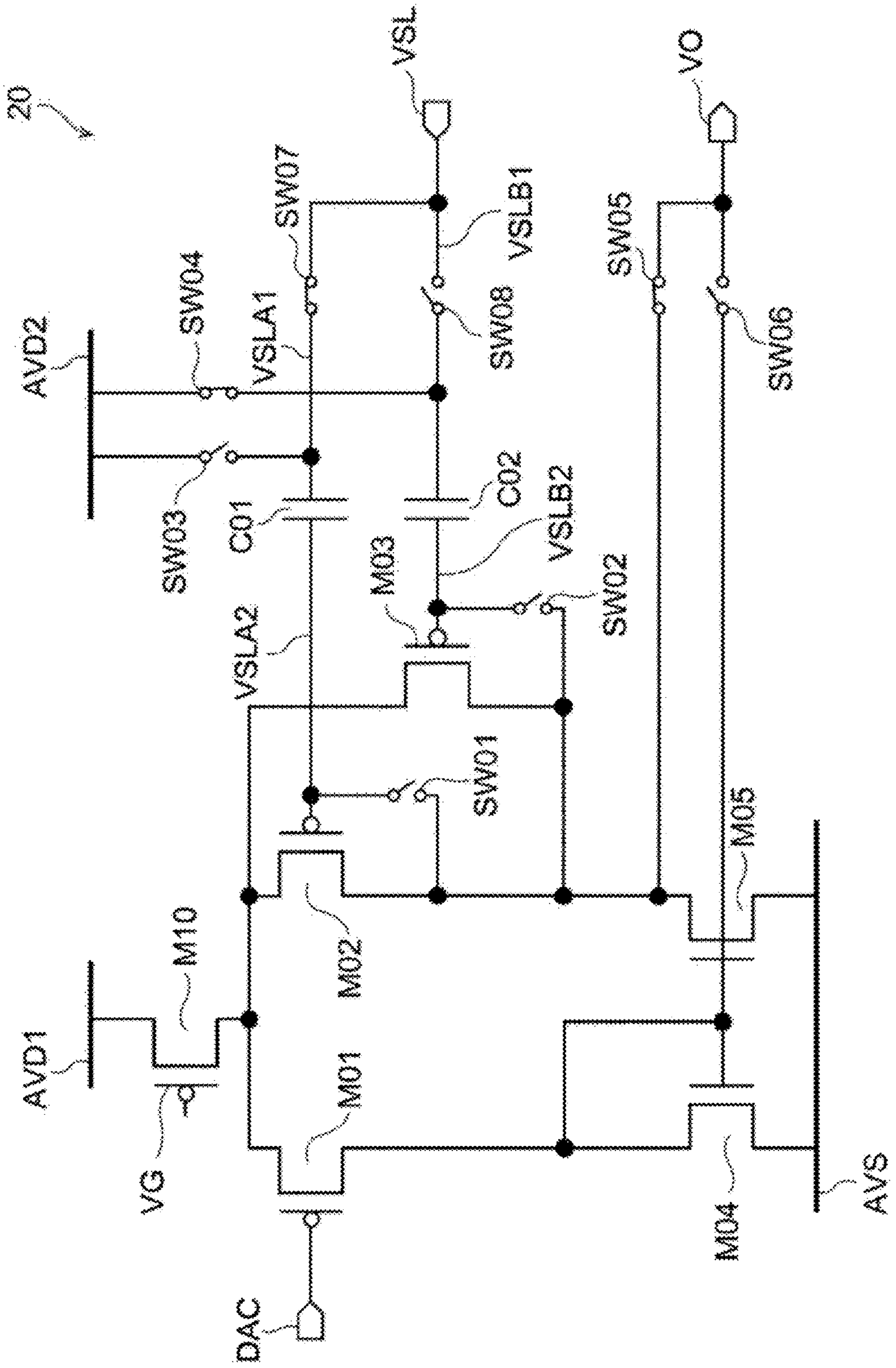
FIG. 11 is a diagram illustrating an example of the comparator according to the embodiment.

FIG. 11 is a circuit diagram corresponding to a period (5) in the timing chart. At this timing, the first switch SW01 is turned off by AZ1A, the second switch SW02 is turned off by AZ1B, the fourth switch SW04 is turned on and the seventh switch SW07 is turned on by AZFA, and the third switch SW03 is turned off and the eighth switch SW08 is turned off by AZFB.

In this period, the reference signal corresponding to the low gain and the output from the pixel circuit corresponding to the low gain are input to execute the reading of the pixel value at low gain. The read signal value is output via the fifth switch SW05 that is turned on.

Thereafter, by repeating the above periods (1) to (5), the pixel values (for example, reading of the pixel circuits belonging to the column sequentially) at high gain and low gain for every pixel circuit can be accurately read.

Throughout the entire timing chart, the tenth transistor M10 may be switched on and off at appropriate timing. That is, by switching on and off the tenth transistor M10 at appropriate timing with respect to the initialization period and the output period in the period in which the output from the comparator 20 is performed, reduction of power consumption, suppression of leakage current at the time of non-operation, and the like in the comparator 20 can be realized.

As described above, according to the comparator 20 according to the present embodiment, the area in which the switches, the capacitors, and the transistors for resetting are disposed is reduced, and meanwhile, the reading of the pixel values appropriate for dynamic range correction can be realized.

Note that the low gain and the high gain are relative terms indicating that the gain for acquiring one pixel value is different from the gain for acquiring the other pixel value, and are not limited to any value.

For example, the reference signal is used by switching between a first ramp signal for acquiring the pixel value controlled with a first gain that is the low gain and a second ramp signal for acquiring the pixel value controlled with a second gain that is the gain higher than the first gain. During the periods (2) and (5) described above, the reset and the data reading are executed by using the first ramp signal, and during the period (4), the reset and the data reading are executed by using the second ramp signal.

In the comparator 20, by having the first ramp signal input thereto, a current based on the potential difference between the first ramp signal and the input signal is output from the drain of the fifth transistor M05. Similarly, in the comparator 20, by having the second ramp signal input thereto, a current based on the potential difference between the second ramp signal and the input signal is output from the drain of the fifth transistor M05.

In this manner, the comparator 20 can acquire and selectively output the pixel value according to the gain.

Note that, in each embodiment described below, the similar terms (low gain/high gain) are used.

Second Embodiment

Figure 12:
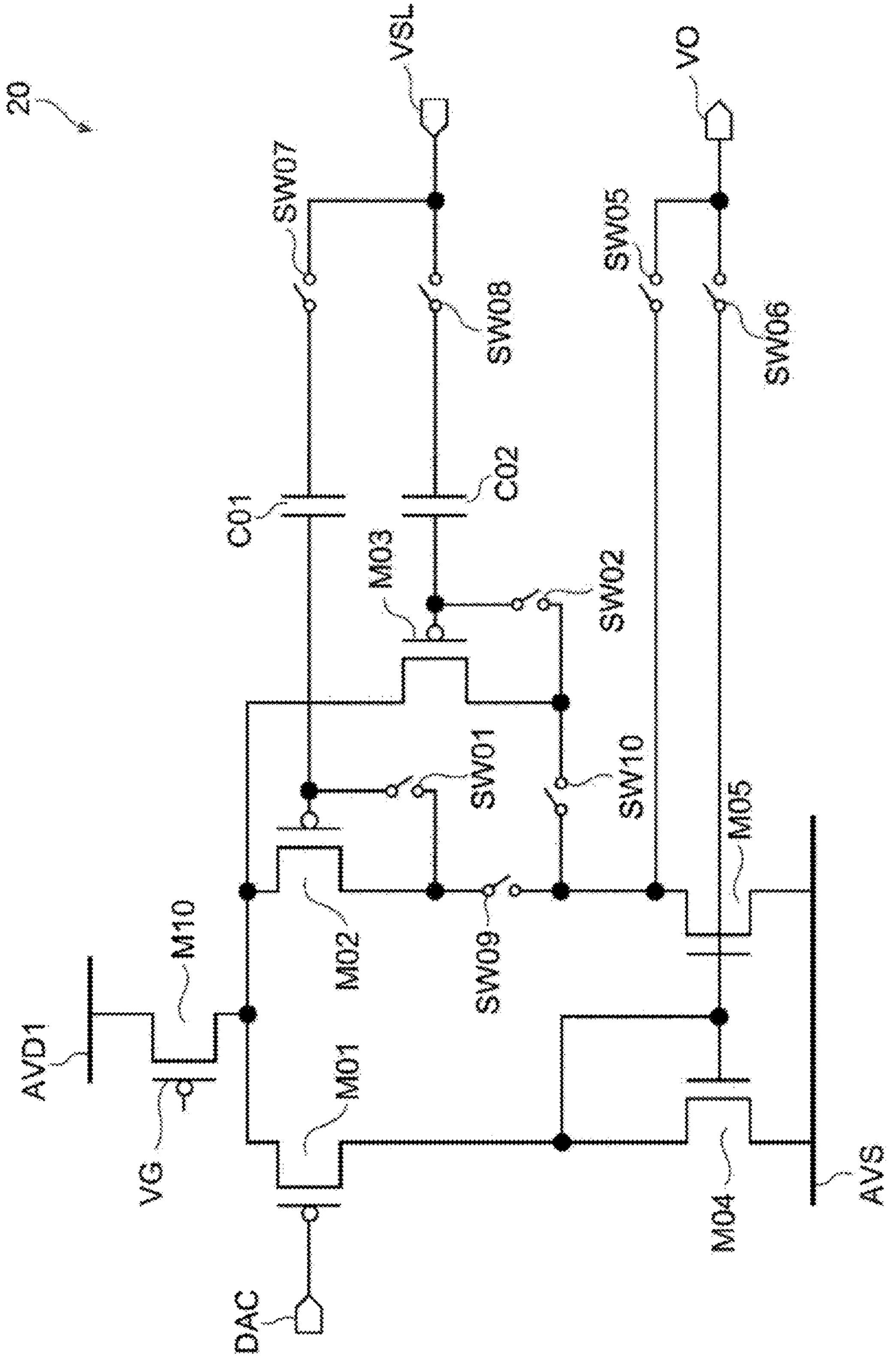
FIG. 12 is a diagram illustrating an example of the comparator according to the embodiment.

FIG. 12 is a circuit diagram illustrating a comparator 20 according to an embodiment. As illustrated in FIG. 12, a switch for pulling up a first capacitor C01 and a second capacitor C02 may be deleted. Furthermore, in order to make the output corresponding to the low gain and the output corresponding to the high gain clearer, a ninth switch SW09 and a tenth switch SW10 may be provided between the drain of a second transistor M02 and the drain of a fifth transistor M05, and between the drain of a third transistor M03 and the drain of a fifth transistor M05, respectively.

The ninth switch SW09 is turned on at the timing when a fifth switch SW05 is turned on to output the read value at low gain and at the timing when a first switch SW01 is turned on to initialize the first capacitor C01.

Similarly, the tenth switch SW10 is turned on at the timing when the fifth switch SW05 is turned on to output the read value at high gain and at the timing when a second switch SW02 is turned on to initialize the second capacitor C02.

As described above, a switch that selectively turns on the transistors may be provided for the outputs of the plurality of output-side transistors forming the differential pair.

Third Embodiment

In the first embodiment and the second embodiment, the transistor that receives the signal output from the pixel circuit is disposed for each of the low-gain pixel signal and the high-gain pixel signal, but the present invention is not limited thereto.

Figure 13:
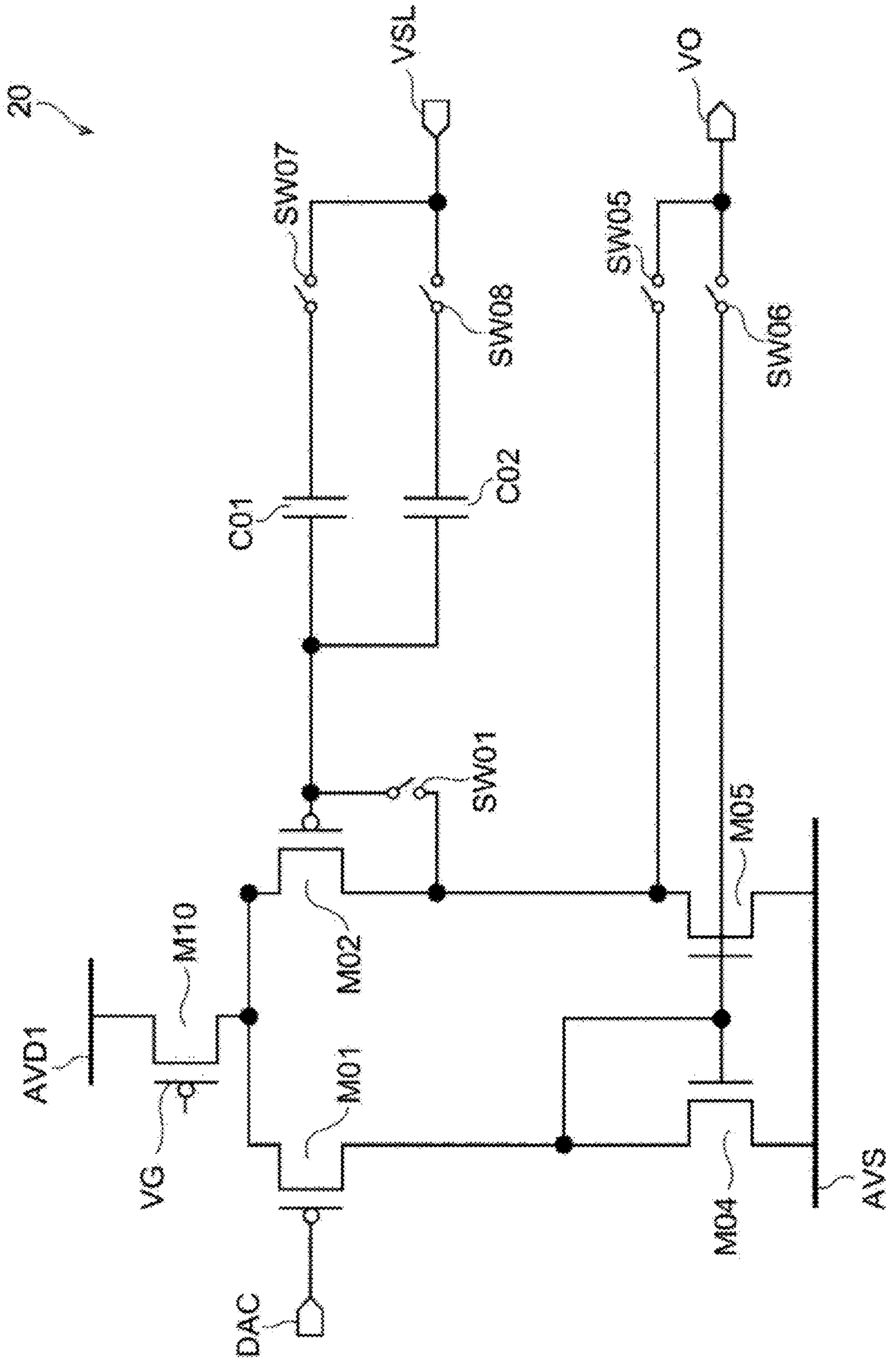
FIG. 13 is a diagram illustrating an example of the comparator according to the embodiment.

FIG. 13 is a circuit diagram illustrating a comparator 20 according to an embodiment. As illustrated in FIG. 13, the transistors forming the input differential pair may include a first transistor M01 that receives the reference signal and a second transistor M02 that receives the pixel signal. That is, the transistors for receiving the two input signals disposed in parallel in the above-described embodiment can be formed by being disposed as one transistor.

For example, the gate of the first transistor M01 is connected to a DAC terminal to which the reference signal is input. The second transistor M02 shares the source with the first transistor M01, and the input signal from the pixel circuit is applied to the gate of the second transistor M02 via a capacitor and a switch. The first transistor M01 and the second transistor M02 form the input differential pair.

A first switch SW01 is connected between the gate and the drain of the second transistor M02.

One end of a first capacitor C01 and one end of a second capacitor C02 are connected to the gate of the second transistor M02. The first capacitor C01 is connected to a VSL terminal via a seventh switch SW07, and the second capacitor C02 is connected to the VSL terminal via an eighth switch SW08. In other words, as illustrated in the drawing, these switches and capacitors are provided in parallel between the VSL terminal and the gate of the second transistor M02.

A fourth transistor shares the drain with the first transistor M01, has the drain and the gate connected to each other, and shares the gate with a fifth transistor M05. The fifth transistor M05 shares the drain with the second transistor M02. These transistors form a current mirror corresponding to the input differential pair.

In this arrangement, the comparator 20 selectively outputs the potential of the drain of the fourth transistor or the drain of the fifth transistor.

There is no significant difference in operation from the timing chart illustrated in FIG. 6.

In the initialization period, the first switch SW01 and the seventh switch SW07 are turned on. In the reset period at low gain, the first switch SW01 is turned on, and the seventh switch SW07 and the eighth switch SW08 are turned off.

In the reset period at low gain, the first switch SW01 is turned off, and the seventh switch SW07 is turned on. In this state, the ramp signal for acquiring the pixel value at low gain is input to the gate of the first transistor M01.

In the reset period at high gain, the seventh switch SW07 is turned off, and the eighth switch SW08 is turned on. In this state, the ramp signal for acquiring the pixel value at high gain is input to the gate of the first transistor M01.

In the data reading period at high gain, the ramp signal for acquiring the pixel value at high gain is input to the gate of the first transistor M01, and the signal acquired at high gain from the pixel circuit is input to the gate of the second transistor M02 in the state of the switches described above.

In the data reading period at low gain, the seventh switch SW07 is turned on and the eighth switch SW08 is turned off again. In this state, the ramp signal for acquiring the pixel value at low gain is input to the gate of the first transistor M01, and the signal acquired at low gain from the pixel circuit is input to the gate of the second transistor M02.

As described above, even in a case where the number of transistors to which the input signal is applied is one, pixel values appropriately controlled with the low gain and the high gain can be acquired in the similar arrangement.

Fourth Embodiment

Figure 14:
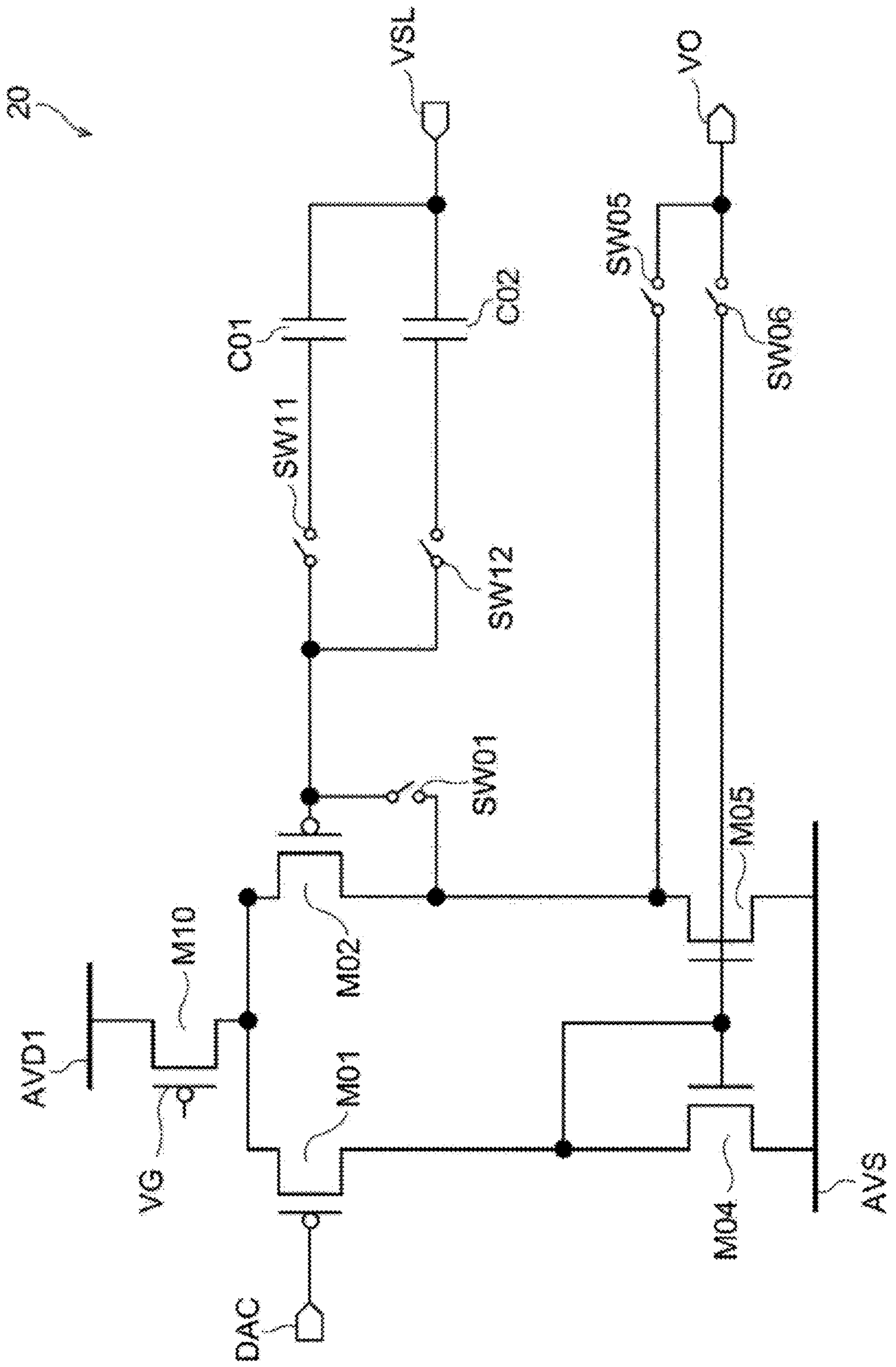
FIG. 14 is a diagram illustrating an example of the comparator according to the embodiment.

FIG. 14 is a circuit diagram illustrating a comparator 20 according to an embodiment. In each of the above-described embodiments, the switch is provided between the terminal to which the input signal is applied and the capacitor, but these switches may be provided between the capacitor and the gate of the transistor constituting the differential pair.

For example, as illustrated in FIG. 14, the comparator 20 may include an eleventh switch SW11 between the gate of a second transistor M02 and a first capacitor C01, and may include a twelfth switch SW12 between the gate of the second transistor M02 and a second capacitor C02.

Also in other embodiments, the comparator 20 may include the eleventh switch SW11 instead of the seventh switch SW07, and may include the twelfth switch SW12 instead of the eighth switch SW08.

Fifth Embodiment

Figure 15:
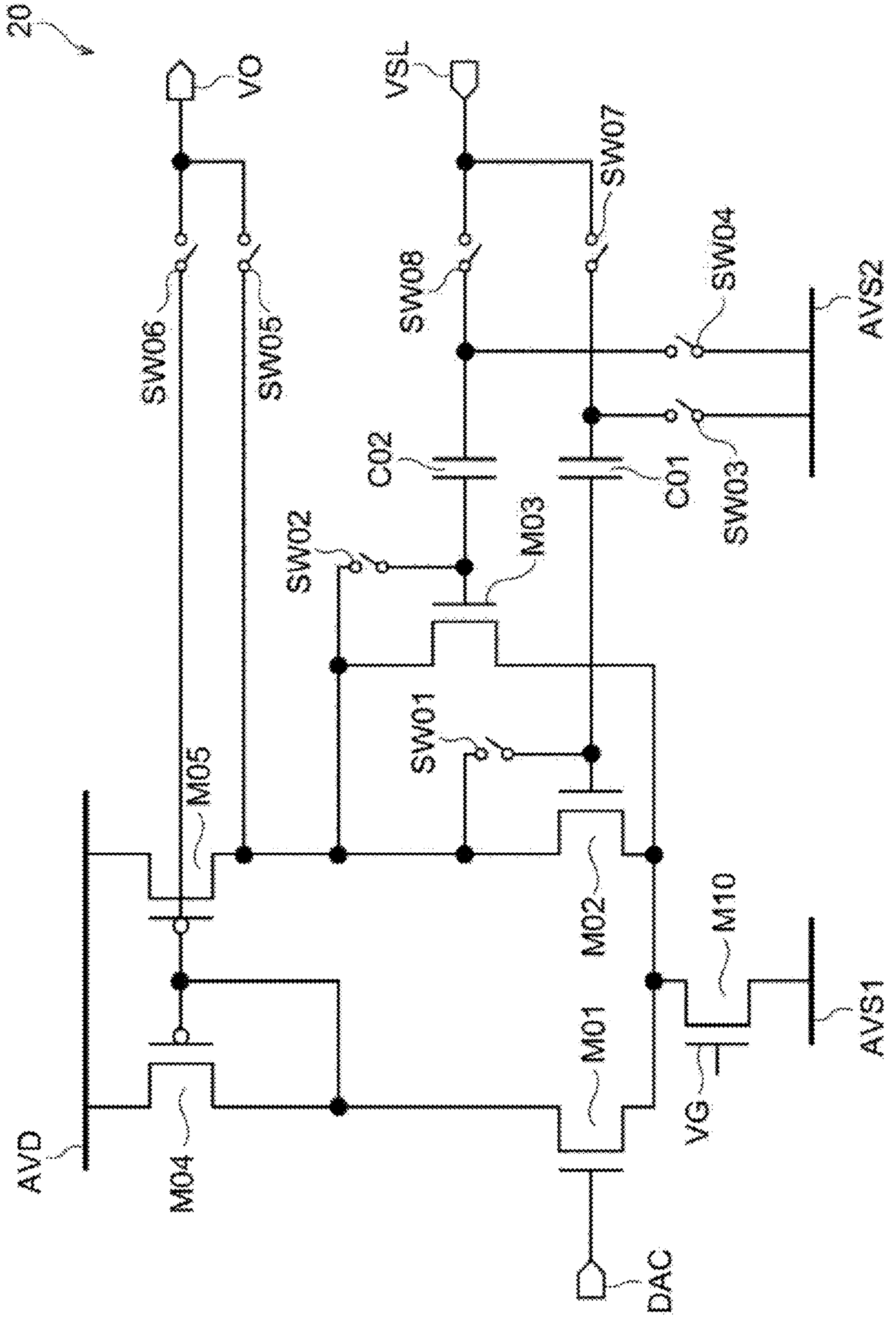
FIG. 15 is a diagram illustrating an example of the comparator according to the embodiment.

FIG. 15 is a circuit diagram illustrating a comparator 20 according to an embodiment. In each embodiment of the present disclosure, a comparison circuit is formed by a transistor of a first conductivity type constituting a differential pair and a transistor of a second conductivity type constituting a current mirror. In each of the above-described embodiments, the first conductivity type is p-type, and the second conductivity type is n-type.

In the present embodiment, as shown in FIG. 15, the first conductivity type is n-type, and the second conductivity type is p-type. The conductivity type of each transistor may be changed as long as an appropriate current is output.

In a case where the conductivity type is changed, as illustrated in the drawing, the connection relationship between the positive-side power supply voltage and the negative-side power supply voltage is also reversed. That is, the input transistors constituting the differential pair is connected to the negative-side power supply voltage, and the output transistors constituting the current mirror is connected to the positive-side power supply voltage. Furthermore, in a case where the pull-up and the reset are performed in the above-described embodiments, the embodiment is implemented as a mode in which the pull-down and the reset is performed.

As described above, the similar operation can be performed even if the conductivity type is set to a relationship opposite to that of each of the above-described embodiments.

In a case where the tenth transistor M10 is provided between the source of the transistor constituting the differential pair and the power supply voltage, by setting the negative-side power supply voltage to the ground voltage, the voltage is raised by an amount corresponding to the voltage drop in the tenth transistor M10. Therefore, it should be noted that the output signal is a signal value raised by the same amount of voltage.

As described above, the comparator 20 according to each embodiment of the present disclosure may include at least one of the transistors constituting the differential pair, for example, a switch for initializing the capacitor or the like on the side on which the pixel signal is captured. As a result, the scale of the circuit can be greatly reduced as compared with the case where the initialization switches are provided on both sides. Furthermore, as compared with a case where the comparator corresponding to the high gain and the comparator corresponding to the low gain are respectively provided, the circuit scale can be further reduced.

As described above, according to each embodiment, by acquiring the pixel values in the order of the reset at low gain, the reset at high gain, the data reading, and the data reading at low gain, the comparison for performing the AD conversion can be appropriately performed on the pixel values having different gains. For this reason, the pixel values for generating a highly accurate HDR image can be acquired while having the circuit scale reduced.

From the pixel circuit illustrated in the non-limiting examples of FIGS. 2 to 4, a pixel value controlled with the low gain and a pixel value controlled with the high gain by using the comparator 20 illustrated in each embodiment can be acquired, and each pixel value can be appropriately AD-converted in the processing unit in FIG. 1 by, for example, a converter included in the processing unit 14 to acquire a digital signal indicating the pixel value. By inputting the digital signal to the image processing circuit, a solid-state imaging device that generates the HDR image can be configured.

In each of the above-described embodiments, for example, the downward ramp signal illustrated in FIG. 6 has been described, but the present invention is not limited thereto. For example, the similar comparison can be realized even if the upward ramp signal is used. Therefore, the comparator 20 described in some embodiments in the present disclosure can be used not only for reading by the correlated double sampling (CDS) method but also for reading by the double delta sampling (DDS) method.

Furthermore, according to the comparator 20 in the present disclosure, in a case where two reading systems are provided, for example, even in a case where pieces of data for two lines are acquired in parallel for the same column, a circuit that outputs a ramp signal used as a reference signal can be configured as the same circuit.

Figure 16:
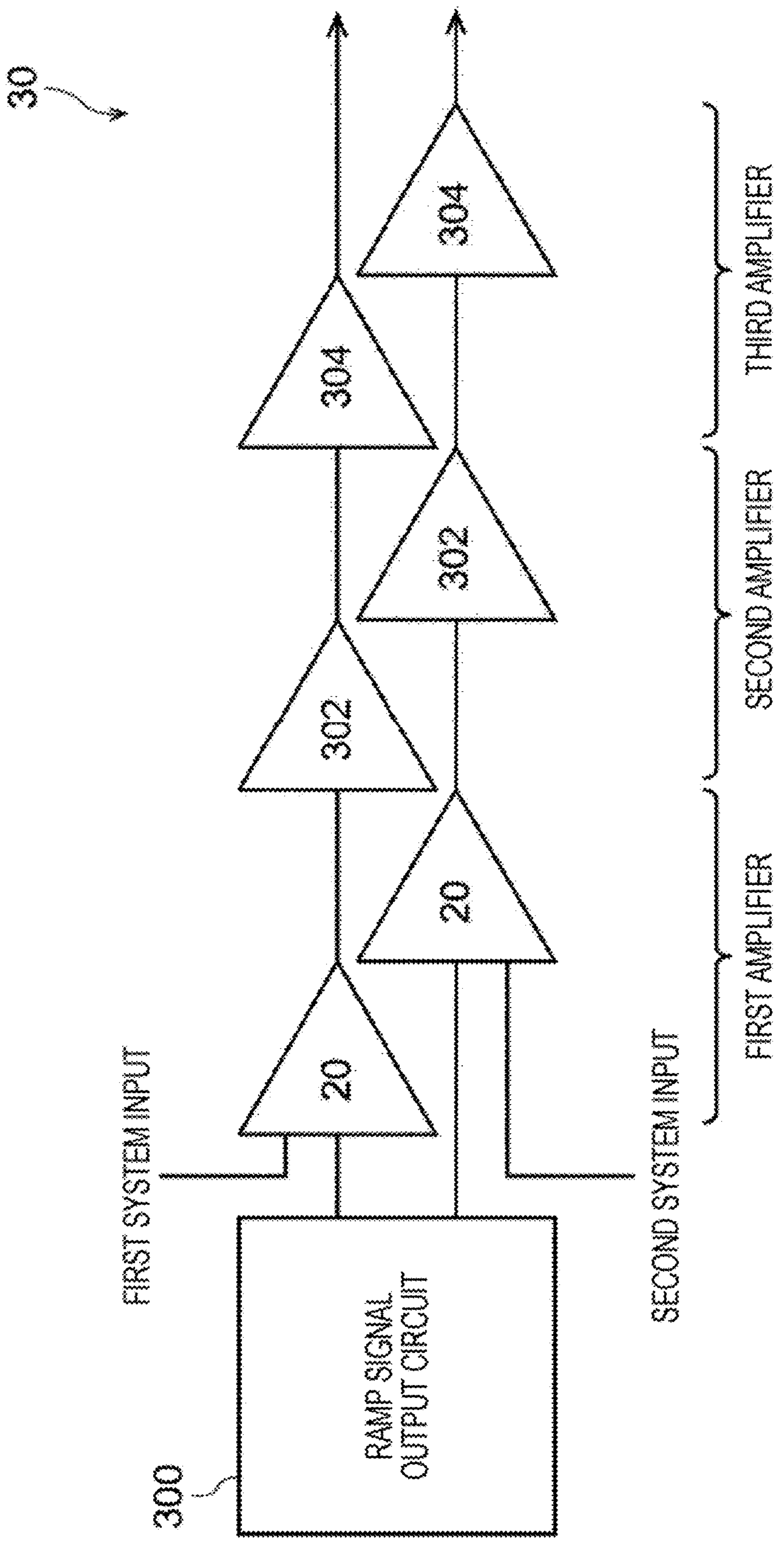
FIG. 16 is a diagram illustrating an example of an amplifier circuit according to the embodiment.

FIG. 16 is a diagram illustrating an example of an amplifier circuit using the comparator 20. For example, the amplifier circuit 30 includes a ramp signal output circuit 300, and moreover, includes a first amplifier circuit, a second amplifier circuit, and a third amplifier circuit in two systems in parallel. That is, the amplifier circuit 30 includes two output lines.

As described above, by using the comparator 20 in the present disclosure as the first amplifier circuit which is the first stage of the amplifier circuit, it is sufficient that one ramp signal output circuit 300 is disposed for the outputs of two systems.

The ramp signal output circuit 300 outputs ramp signals to the first-stage comparator 20 of the first system and the first-stage comparator 20 of the second system at the same timing.

The first-stage comparator 20 of the first system receives the ramp signal and the first-system input, compares the ramp signal and the first-system input, and outputs the comparison result. The first-stage comparator 20 of the second system receives the ramp signal and the second-system input, compares the ramp signal and the second-system input, and outputs the comparison result. That is, the amplifier circuits of two systems can be connected to one ramp signal output circuit.

Figure 17:
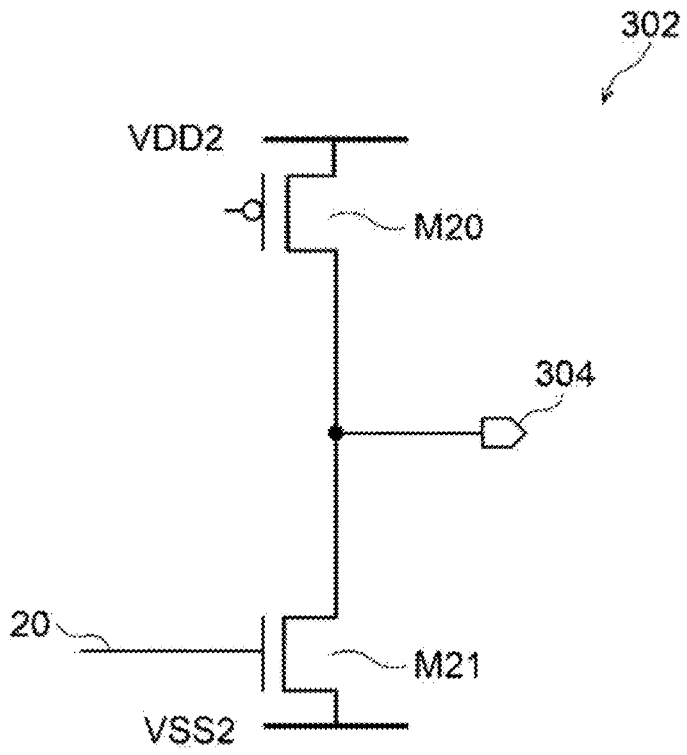
FIG. 17 is a diagram illustrating an example of the amplifier circuit according to the embodiment.

FIG. 17 is a circuit diagram illustrating a non-limiting example of a simple implementation of the second amplifier circuit 302 in FIG. 16. The second amplifier circuit 302 may include transistors M20 and M21.

The transistor M20 is, for example, a p-type MOSFET, and a power supply voltage VDD2 is applied to the source and an appropriate bias voltage is applied to the gate.

The transistor M21 is, for example, an n-type MOSFET, and has the source connected to a power supply voltage VSS2, the gate connected to the output (terminal VO) of the comparator 20, and the drain connected to the drain of the transistor M20.

In the second amplifier circuit 302, the shared drains of the transistors M20 and M21 are connected to the output terminal. The signal output from the comparator 20 is amplified on the basis of the gate voltage applied to the gate of the transistor M20, inverted, and output to the output terminal.

Figure 18:
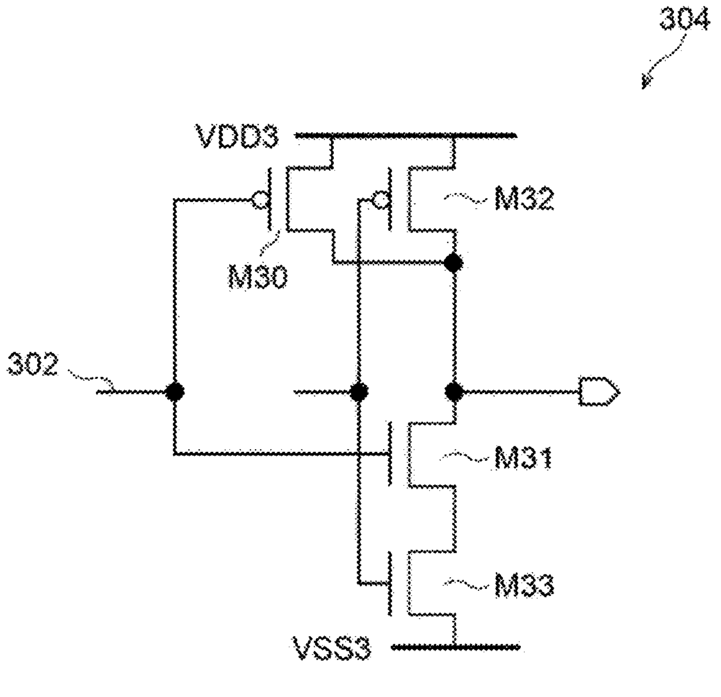
FIG. 18 is a diagram illustrating an example of the amplifier circuit according to the embodiment.

FIG. 18 is a circuit diagram illustrating a non-limiting example of a simple implementation of the third amplifier circuit 304 in FIG. 16. The third amplifier circuit 304 may include transistors M30, M31, M32, and M33.

The transistor M30 is, for example, a p-type MOSFET, and has the source connected to a power supply voltage VDD3 and the gate connected to the output of the second amplifier circuit 302.

The transistor M31 is, for example, an n-type MOSFET, and has the drain connected to the drain of the transistor M30 and the gate connected to the gate of the transistor M30.

The transistor M32 is, for example, a p-type MOSFET, and has the source connected to the power supply voltage VDD3, has the gate applied with an appropriate bias voltage, and the drain connected to the drains of the transistors M30 and M31.

The transistor M33 is, for example, an n-type MOSFET, and has the drain connected to the source of the transistor M31, the gate connected to the gate of the transistor M32, and the source connected to a power supply voltage VSS3.

In the third amplifier circuit 304, the drain of the transistor M31 is connected to the output terminal. With this configuration, as an example, the third amplifier circuit 304 amplifies and outputs the output of the second amplifier circuit 302 by a circuit that calculates a negative AND (NAND) of the output of the second amplifier circuit 302 and the bias input.

Note that FIGS. 17 and 18 illustrate the minimum possible configurations, and the configurations of the second amplifier circuit 302 and the third amplifier circuit 304 are not limited thereto, and it is not excluded that an element or the like for stabilizing the signal is appropriately provided.

Figure 19:
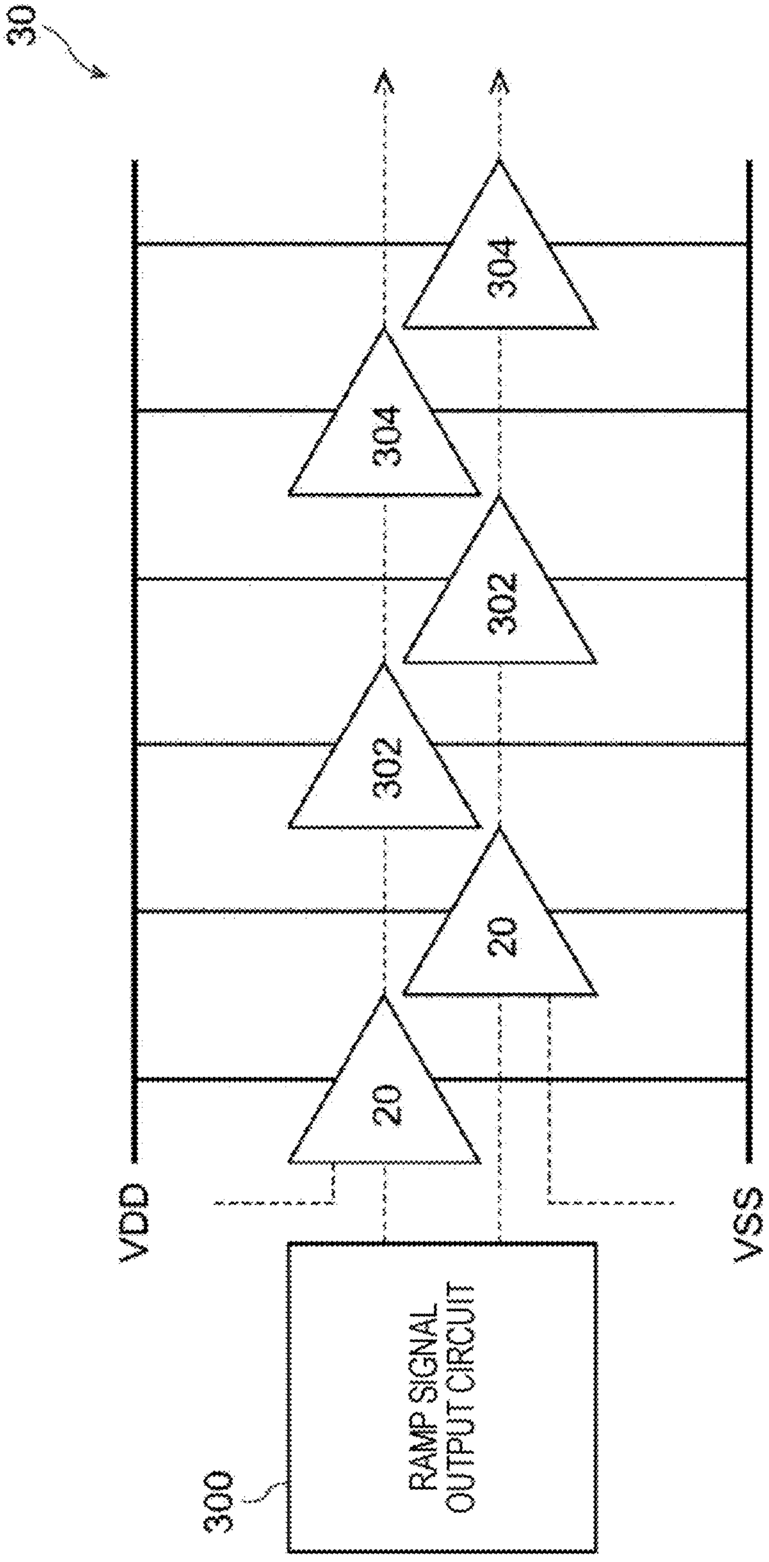
FIG. 19 is a diagram illustrating an example of the amplifier circuit according to the embodiment.

FIG. 19 is a diagram illustrating an example of a connection state of the power supply in FIG. 16. As illustrated in FIG. 19, the amplifier circuit 30 can set the power supply voltages of the comparator 20 as the first amplifier circuit, the second amplifier circuit 302, and the third amplifier circuit 304 to the same VDD and VSS.

With such a power supply, a step caused by the power supply voltage between the low gain and the high gain can be eliminated.

Figure 20:
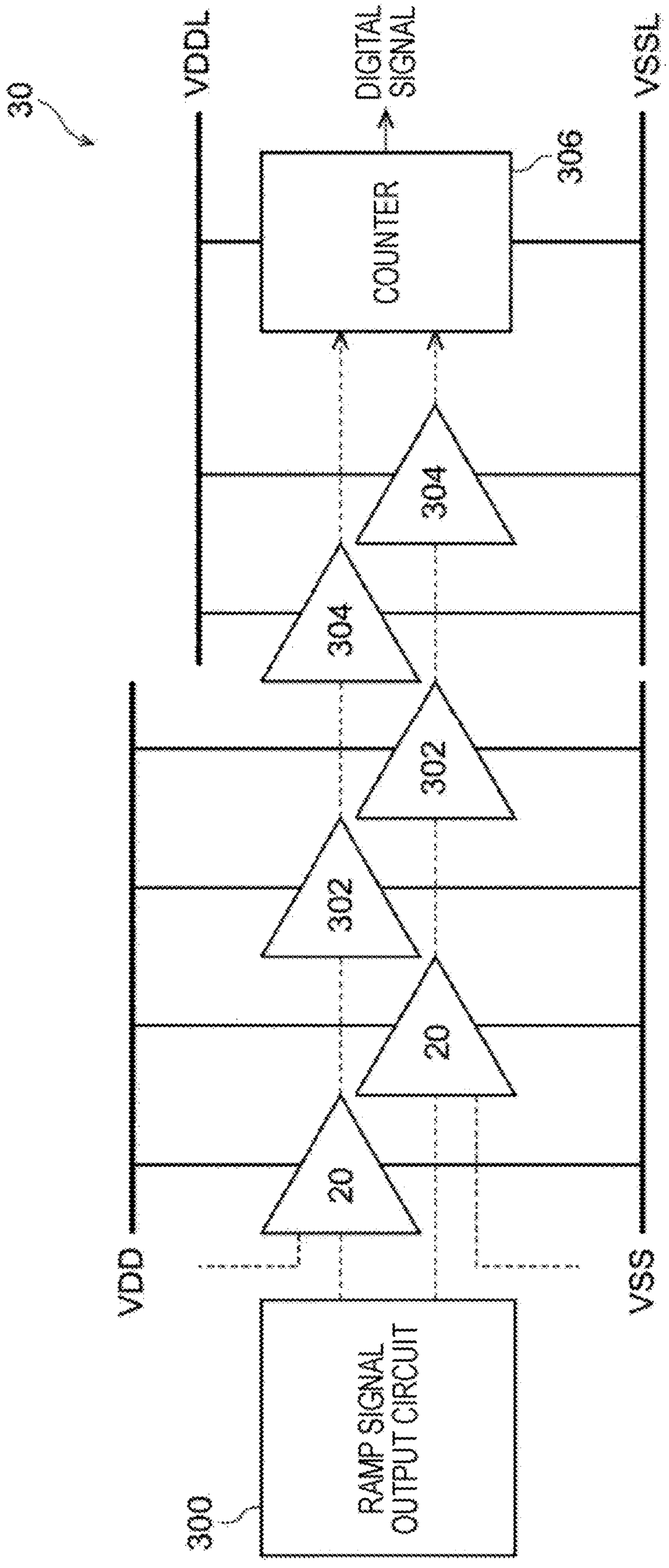
FIG. 20 is a diagram illustrating an example of the amplifier circuit according to the embodiment.

FIG. 20 is a diagram illustrating an example of a connection state of a power supply voltage different from that in FIG. 19. As illustrated in FIG. 20, the power supply voltages of the comparator 20 and the second amplifier circuit 302 can be matched, and the power supply voltage of the third amplifier circuit 304 can be matched with the power supply voltage of a counter 306 connected to the subsequent stage of the third amplifier circuit 304.

Figure 21:
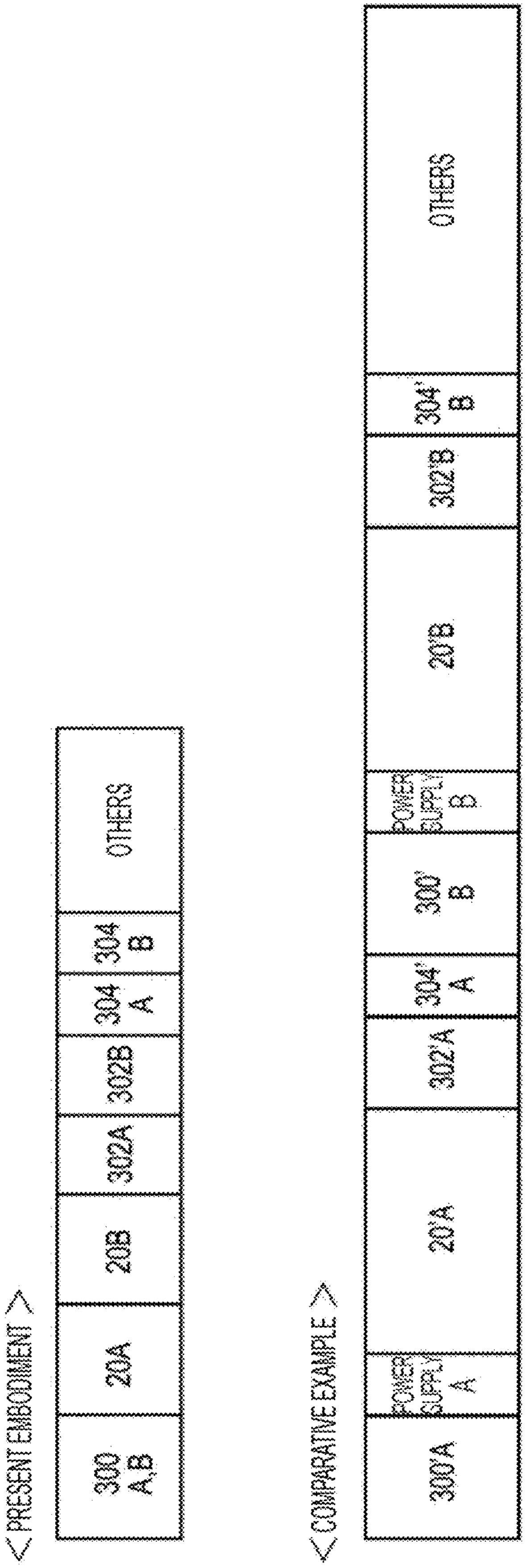
FIG. 21 is a diagram illustrating an example of the amplifier circuit according to the embodiment.

FIG. 21 is a diagram in which a layout illustrated in the amplifier circuit 30 according to the present embodiment and a layout according to a comparative example are aligned. Each of A and B in the reference sign indicates a circuit that performs processing in each path of two signal lines connected and processed by the same signal line.

As described above, according to the present embodiment, the number of differential pairs of the comparator 20 can be reduced by making the number of differential pairs to which the ramp signal and the pixel signal are input in the comparator 20 to one, and disposing the reset transistor only on one side. Therefore, the circuit area can be significantly reduced. Furthermore, the circuit for generating the ramp signal can be shared by two lines.

Therefore, as illustrated in the upper diagram, the circuits in the line A and the line B can be alternately disposed. According to the present embodiment, as described above, by significantly reducing the area of the layout and alternately disposing the processing circuits of two systems, the difference in the path length after output can be significantly reduced, and the error in the signal value depending on the path length in the outputs of the two systems can be reduced.

On the other hand, according to the comparative example, a circuit that generates the ramp signal is required in each system, and the circuit area of the comparator 20' is increased by the amount of area of the differential pair. Moreover, a power supply for generating the reset voltage for the transistor to which the ramp signal is input is required. Furthermore, in the upper diagram, because the same circuit of different systems can be continuously generated, the area can be reduced by the amount of the circuit elements such as the power supply that can be shared in each circuit. However, in the lower diagram, the same circuit in different systems also needs to be disposed again in each circuit, and the layout area becomes significantly wider than that of the present embodiment due to such a plurality of factors.

For example, the height in the drawing can also be reduced in the present embodiment with respect to the comparative example, and the length in the drawing can also be reduced to about half the size in the present embodiment with respect to the comparative example.

For example, even in a case where the second amplifier circuit and the third amplifier circuit are connected in series in the subsequent stage of the comparator 20, the first system and the second system can be alternately disposed in the circuit layout as illustrated in FIG. 16. As a result, the signal output from the third amplifier circuit can reduce the path length difference after being output, and even in a case where the outputs from two systems are performed in parallel, unevenness of signal deterioration due to the path length, the parasitic capacitance, and the like can be suppressed.

Application Example

The technology according to the present disclosure can be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, a robot, a construction machine, or an agricultural machine (tractor).

Figure 22:
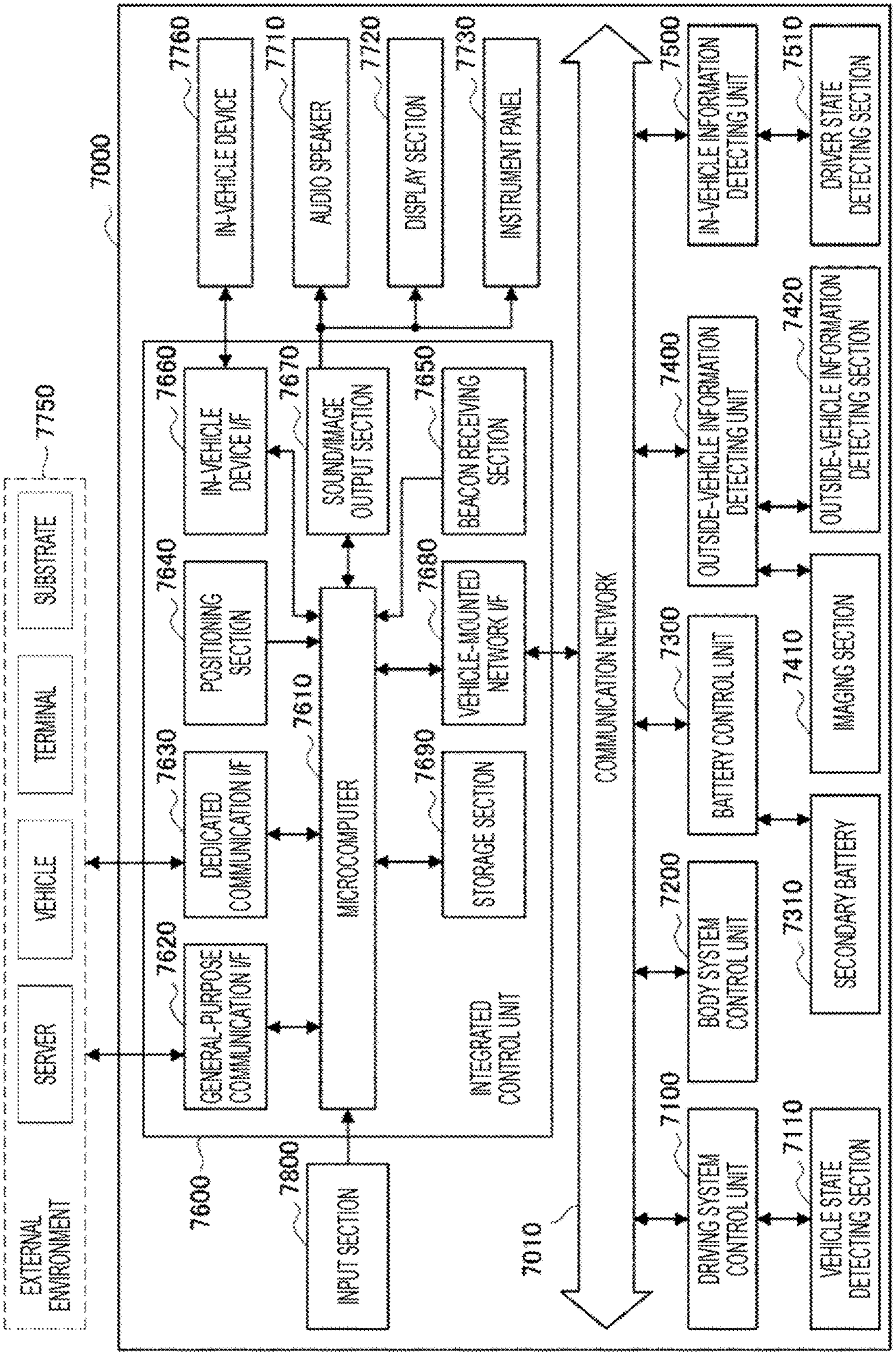
FIG. 22 is a block diagram illustrating an example of a schematic configuration of a vehicle control system.

FIG. 22 is a block diagram illustrating a schematic configuration example of a vehicle control system 7000 which is an example of a mobile body control system to which the technology according to the present disclosure can be applied. The vehicle control system 7000 includes a plurality of electronic control units connected to each other via a communication network 7010. In the example illustrated in FIG. 22, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. In FIG. 22, a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690 are illustrated as a functional configuration of the integrated control unit 7600. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

Figure 23:
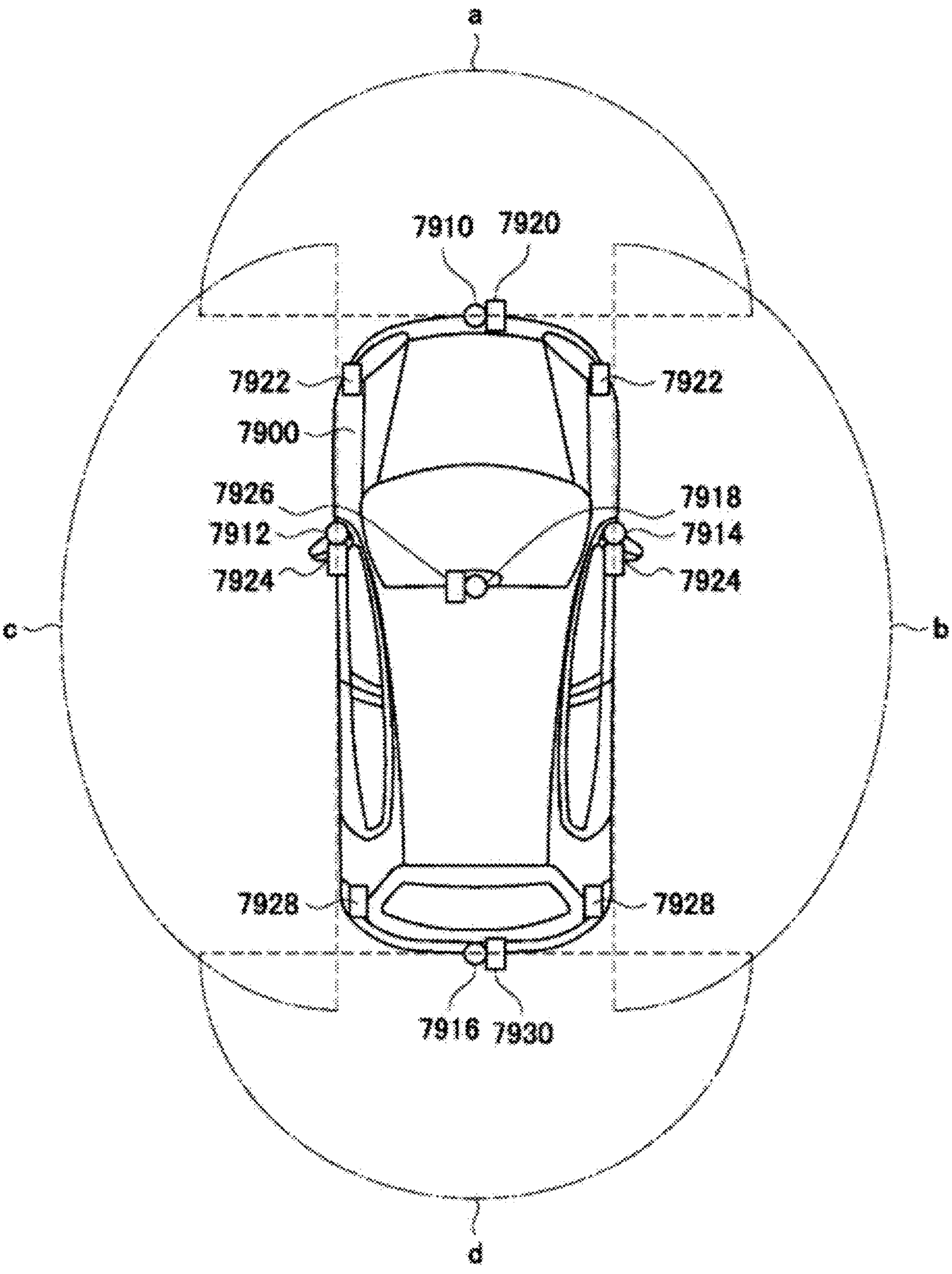
FIG. 23 is an explanatory diagram illustrating an example of installation positions of an outside-vehicle information detecting section and an imaging section.

Here, FIG. 23 illustrates an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Note that FIG. 23 illustrates an example of an imaging range of each of the imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 22, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM (registered trademark)), worldwide interoperability for microwave access (WiMAX (registered trademark)), long term evolution (LTE (registered trademark)), LTE-advanced (LTE-A), or the like, or another wireless communication protocol such as wireless LAN (referred to also as wireless fidelity (Wi-Fi (registered trademark)), Bluetooth (registered trademark), or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth (registered trademark), near field communication (NFC), or wireless universal serial bus (WUSB). In addition, the in-vehicle device I/F 7660 may establish wired connection by universal serial bus (USB), high-definition multimedia interface (HDMI (registered trademark)), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automated driving, which makes the vehicle to travel automatedly without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example in FIG. 22, an audio speaker 7710, a display section 7720, and an instrument panel 7730 are exemplified as output devices. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Note that, in the example illustrated in FIG. 22, at least two control units connected to each other via the communication network 7010 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

Note that a computer program for realizing each function of the processing circuit according to the present embodiment described with reference to FIGS. 1 to 21 can be mounted on any control unit or the like. Furthermore, a computer-readable recording medium in which such a computer program is stored can be provided. The recording medium is, for example, a magnetic disk, an optical disk, a magneto-optical disk, a flash memory, or the like. Furthermore, the computer program described above may be distributed via, for example, a network without using a recording medium.

In the vehicle control system 7000 described above, the solid-state imaging device 1 according to the embodiment described with reference to FIGS. 1 to 21 can be applied to at least some of the imaging section 7410, the outside-vehicle information detecting section 7420, or the driver state detecting section 7510 of the application example illustrated in FIG. 22.

The embodiment described above may have the following modes.

(1)

A comparator including:

- a first transistor having a gate to which a reference signal is input;
- a second transistor having a source connected to a source of the first transistor;
- a third transistor having a source connected to the source of the first transistor and having a drain connected to a drain of the second transistor;
- a first switch connected between a gate and the drain of the second transistor;
- a second switch connected between a gate and the drain of the third transistor;
- a first capacitor having a first end connected to the gate of the second transistor and a second end connected to an input signal terminal;
- a second capacitor having a first end connected to the gate of the third transistor and a second end connected to the input signal terminal;
- a fourth transistor having a drain connected to a drain of the first transistor and having a gate connected to the drain of the fourth transistor;
- a fifth transistor having a drain connected to the drain of the second transistor and the drain of the third transistor, and having a gate connected to the gate of the fourth transistor, in which the fourth transistor or the fifth transistor has the drain whose potential is selectively connected to an output terminal.

(2)

The comparator according to (1), further including:

- a third switch connected between the second end of the first capacitor and a power supply voltage; and
- a fourth switch connected between the second end of the second capacitor and the power supply voltage.

(3)

The comparator according to (1) or (2), further including:

- a fifth switch connected between the drain of the fifth transistor and the output terminal; and
- a sixth switch connected between the gate of the fifth transistor and the output terminal, in which the fifth switch and the sixth switch are exclusively turned on.

(4)

The comparator according to any one of (1) to (3), further including:

a seventh switch connected between the second end of the first capacitor and the input signal terminal; and an eighth switch connected between the second end of the second capacitor and the input signal terminal.

(5)

The comparator according to any one of (1) to (4), in which the first transistor, the second transistor, and the third transistor are each a MOSFET of a first conductivity type, and the fourth transistor and the fifth transistor are each a MOSFET of a second conductivity type different from the first conductivity type.

(6)

The comparator according to (5), in which the first conductivity type is a p-type, and the second conductivity type is an n-type.

(7)

The comparator according to (6), in which the first transistor, the second transistor, and the third transistor each have the source connected to a positive-side power supply voltage, and the fourth transistor and the fifth transistor each have the source connected to a negative-side power supply voltage.

(8)

The comparator according to (5), in which the first conductivity type is an n-type, and the second conductivity type is a p-type.

(9)

The comparator according to (8), in which the first transistor, the second transistor, and the third transistor each have the source connected to a negative-side power supply voltage, and the fourth transistor and the fifth transistor each have a source connected to a positive-side power supply voltage.

(10)

The comparator according to any one of (1) to (9), further including:

a ninth switch connected between the drain of the second transistor and the drain of the fifth transistor; and a tenth switch connected between the drain of the third transistor and the drain of the fifth transistor.

(11)

The comparator according to any one of (1) to (10), in which the reference signal is a signal in which a first ramp signal that acquires a pixel value controlled with a first gain and a second ramp signal that acquires a pixel value controlled with a second gain higher than the first gain are switched, the second transistor forms a differential pair with the first transistor and outputs a current based on the first ramp signal and a voltage applied to the input signal terminal, and the third transistor forms a differential pair with the first transistor and outputs a current based on the second ramp signal and a voltage applied to the input signal terminal.

(12)

A comparator including:

a first transistor having a gate to which a reference signal is input;

a second transistor having a source connected to a source of the first transistor;

a first switch connected between a gate and a drain of the second transistor;

a first capacitor having a first end connected to the gate of the second transistor and a second end connected to an input signal terminal;

a second capacitor having a first end connected to the gate of the second transistor and a second end connected to the input signal terminal, and being provided in parallel to the first capacitor;

a fourth transistor having a drain connected to a drain of the first transistor and having a gate connected to the drain of the fourth transistor;

a fifth transistor having a drain connected to the drain of the second transistor and having a gate connected to the gate of the fourth transistor, in which the fourth transistor or the fifth transistor has the drain whose potential is selectively connected to an output terminal.

(13)

The comparator according to (12), further including:

a seventh switch connected between the first capacitor and the input signal terminal; and an eighth switch connected between the second capacitor and the input signal terminal.

(14)

The comparator according to (12), further including:

an eleventh switch provided between the first capacitor and the gate of the second transistor; and a twelfth switch provided between the second capacitor and the gate of the second transistor.

(15)

The comparator according to any one of (12) to (14), in which the reference signal is a signal in which a first ramp signal that acquires a pixel value controlled with a first gain and a second ramp signal that acquires a pixel value controlled with a second gain higher than the first gain are switched, and the second transistor forms a differential pair with the first transistor and selectively outputs a current based on the first ramp signal and a voltage applied to the input signal terminal, or a current based on the second ramp signal and a voltage applied to the input signal terminal.

(16)

An amplifier circuit including:

a ramp signal output circuit that generates a reference signal; and, in a first path and a second path that perform processing of two systems, a first amplifier circuit of a first path including the comparator according to (1) to (15) and connected to the ramp signal output circuit, a first amplifier circuit of a second path including the comparator according to (1) to (15), connected to the ramp signal output circuit, and is disposed adjacent to the first amplifier circuit of the first path, a second amplifier circuit of a first path connected to the first amplifier circuit of the first path and disposed adjacent to the first amplifier circuit of the second path, a second amplifier circuit of a second path connected to the first amplifier circuit of the second path and disposed adjacent to the second amplifier circuit of the first path, a third amplifier circuit of a first path connected to the second amplifier circuit of the first path and disposed adjacent to the second amplifier circuit of the second path, and a third amplifier circuit of a second path connected to the second amplifier circuit of the second path and disposed adjacent to the third amplifier circuit of the first path.

(17)

A solid-state imaging device including:

a light receiving element;

a pixel circuit that outputs a signal output from the light receiving element at timing based on a control signal from a control circuit;

the comparator according to (11) in which a signal output from the pixel circuit is input to an input signal terminal; and a converter that converts an analog signal output from the pixel circuit into a digital signal by using a differential amplification signal based on the first ramp signal and a differential amplification signal based on the second ramp signal, the differential amplification signals being output from the comparator.

(18)

The solid-state imaging device according to (17), further including an image processing circuit that generates a high dynamic range (HDR) image on the basis of a signal output from the converter.

(19)

A solid-state imaging device including:

a light receiving element;

a pixel circuit that outputs a signal output from the light receiving element at timing based on a control signal from a control circuit;

the comparator according to (15) in which a signal output from the pixel circuit is input to an input signal terminal; and a converter that converts an analog signal output from the pixel circuit into a digital signal by using a differential amplification signal based on the first ramp signal and a differential amplification signal based on the second ramp signal, the differential amplification signals being output from the comparator.

(20)

The solid-state imaging device according to (19), further including an image processing circuit that generates a high dynamic range (HDR) image on the basis of a signal output from the converter.

Aspects of the present disclosure are not limited to the above-described embodiments, but include various conceivable modifications, and the effects of the present disclosure are not limited to the above-described contents. The components in each of the embodiments may be appropriately combined and applied. That is, various additions, modifications, and partial deletions can be made without departing from the conceptual idea and gist of the present disclosure derived from the contents defined in the claims and equivalents thereof.

REFERENCE SIGNS LIST

1 Solid-state imaging device
10 Pixel array
11 Control unit
12 Vertical drive unit
120 Horizontal signal line
13 Horizontal drive unit
130, 132 Vertical signal line
14 Processing unit
15 Image processing unit
20 Comparator
30 Amplifier circuit
300 Ramp signal output circuit
302 Second amplifier circuit
304 Third amplifier circuit
306 Counter

The invention claimed is:

1. A comparator comprising:

a first transistor having a gate to which a reference signal is input;

a second transistor having a source connected to a source of the first transistor;

a third transistor having a source connected to the source of the first transistor and having a drain connected to a drain of the second transistor;

a first switch connected between a gate and the drain of the second transistor;

a second switch connected between a gate and the drain of the third transistor;

a first capacitor having a first end connected to the gate of the second transistor and a second end connected to an input signal terminal;

a second capacitor having a first end connected to the gate of the third transistor and a second end connected to the input signal terminal;

a fourth transistor having a drain connected to a drain of the first transistor and having a gate connected to the drain of the fourth transistor;

a fifth transistor having a drain connected to the drain of the second transistor and the drain of the third transistor, and having a gate connected to the gate of the fourth transistor, wherein the fourth transistor or the fifth transistor has the drain whose potential is selectively connected to an output terminal.

2. The comparator according to claim 1, further comprising:

a third switch connected between the second end of the first capacitor and a power supply voltage; and a fourth switch connected between the second end of the second capacitor and the power supply voltage.

3. The comparator according to claim 1, further comprising:

a fifth switch connected between the drain of the fifth transistor and the output terminal; and a sixth switch connected between the gate of the fifth transistor and the output terminal, wherein the fifth switch and the sixth switch are exclusively turned on.

4. The comparator according to claim 1, further comprising:

a seventh switch connected between the second end of the first capacitor and the input signal terminal; and an eighth switch connected between the second end of the second capacitor and the input signal terminal.

5. The comparator according to claim 1, wherein the first transistor, the second transistor, and the third transistor are each a MOSFET of a first conductivity type, and the fourth transistor and the fifth transistor are each a MOSFET of a second conductivity type different from the first conductivity type.

6. The comparator according to claim 5, wherein the first conductivity type is a p-type, and the second conductivity type is an n-type.

7. The comparator according to claim 6, wherein the first transistor, the second transistor, and the third transistor each have the source connected to a positive-side power supply voltage, and the fourth transistor and the fifth transistor each have a source connected to a negative-side power supply voltage.

8. The comparator according to claim 5, wherein the first conductivity type is an n-type, and the second conductivity type is a p-type.

9. The comparator according to claim 8, wherein the first transistor, the second transistor, and the third transistor each have the source connected to a negative-side power supply voltage, and the fourth transistor and the fifth transistor each have a source connected to a positive-side power supply voltage.

10. The comparator according to claim 1, further comprising:
a ninth switch connected between the drain of the second transistor and the drain of the fifth transistor; and
a tenth switch connected between the drain of the third transistor and the drain of the fifth transistor.

11. The comparator according to claim 1, wherein
the reference signal is a signal in which a first ramp signal that acquires a pixel value controlled with a first gain and a second ramp signal that acquires a pixel value controlled with a second gain higher than the first gain are switched,
the second transistor forms a differential pair with the first transistor and outputs a current based on the first ramp signal and a voltage applied to the input signal terminal, and
the third transistor forms a differential pair with the first transistor and outputs a current based on the second ramp signal and a voltage applied to the input signal terminal.

12. A comparator comprising:
a first transistor having a gate to which a reference signal is input;
a second transistor having a source connected to a source of the first transistor;
a first switch connected between a gate and a drain of the second transistor;
a first capacitor having a first end connected to the gate of the second transistor and a second end connected to an input signal terminal;
a second capacitor having a first end connected to the gate of the second transistor and a second end connected to the input signal terminal, and being provided in parallel to the first capacitor;
a fourth transistor having a drain connected to a drain of the first transistor and having a gate connected to the drain of the fourth transistor;
a fifth transistor having a drain connected to the drain of the second transistor and having a gate connected to the gate of the fourth transistor,
wherein the fourth transistor or the fifth transistor has the drain whose potential is selectively connected to an output terminal.

13. The comparator according to claim 12, further comprising:
a seventh switch connected between the first capacitor and the input signal terminal; and
an eighth switch connected between the second capacitor and the input signal terminal.

14. The comparator according to claim 12, further comprising:
an eleventh switch provided between the first capacitor and the gate of the second transistor; and
a twelfth switch provided between the second capacitor and the gate of the second transistor.

15. The comparator according to claim 12, wherein
the reference signal is a signal in which a first ramp signal that acquires a pixel value controlled with a first gain and a second ramp signal that acquires a pixel value controlled with a second gain higher than the first gain are switched, and
the second transistor forms a differential pair with the first transistor and selectively outputs a current based on the first ramp signal and a voltage applied to the input signal terminal, or a current based on the second ramp signal and a voltage applied to the input signal terminal.

16. An amplifier circuit comprising:
a ramp signal output circuit that generates a reference signal; and,
in a first path and a second path that perform processing of two systems,
a first amplifier circuit of a first path comprising the comparator according to claim 1 and connected to the ramp signal output circuit,
a first amplifier circuit of a second path comprising the comparator according to claim 1, connected to the ramp signal output circuit, and is disposed adjacent to the first amplifier circuit of the first path,
a second amplifier circuit of a first path connected to the first amplifier circuit of the first path and disposed adjacent to the first amplifier circuit of the second path,
a second amplifier circuit of a second path connected to the first amplifier circuit of the second path and disposed adjacent to the second amplifier circuit of the first path,
a third amplifier circuit of a first path connected to the second amplifier circuit of the first path and disposed adjacent to the second amplifier circuit of the second path, and
a third amplifier circuit of a second path connected to the second amplifier circuit of the second path and disposed adjacent to the third amplifier circuit of the first path.

17. A solid-state imaging device comprising:
a light receiving element;
a pixel circuit that outputs a signal output from the light receiving element at timing based on a control signal from a control circuit;
the comparator according to claim 11 in which a signal output from the pixel circuit is input to an input signal terminal; and
a converter that converts an analog signal output from the pixel circuit into a digital signal by using a differential amplification signal based on the first ramp signal and a differential amplification signal based on the second ramp signal, the differential amplification signals being output from the comparator.

18. The solid-state imaging device according to claim 17, further comprising an image processing circuit that generates a high dynamic range (HDR) image on a basis of a signal output from the converter.

19. A solid-state imaging device comprising:

a light receiving element;

a pixel circuit that outputs a signal output from the light receiving element at timing based on a control signal from a control circuit;

the comparator according to claim 15 in which a signal output from the pixel circuit is input to an input signal terminal; and a converter that converts an analog signal output from the pixel circuit into a digital signal by using a differential amplification signal based on the first ramp signal and a differential amplification signal based on the second ramp signal, the differential amplification signals being output from the comparator.

20. The solid-state imaging device according to claim 19, further comprising an image processing circuit that generates a high dynamic range (HDR) image on a basis of a signal output from the converter.

* * * * *